United States Patent [19]

Ahrenkiel

[11] Patent Number: 5,929,652
[45] Date of Patent: Jul. 27, 1999

[54] APPARATUS FOR MEASURING MINORITY CARRIER LIFETIMES IN SEMICONDUCTOR MATERIALS

[75] Inventor: Richard K. Ahrenkiel, Lakewood, Colo.

[73] Assignee: Midwest Research Institute, Kansas City, Mo.

[21] Appl. No.: 08/922,003

[22] Filed: Sep. 2, 1997

[51] Int. Cl.⁶ ............................................. G01R 31/26
[52] U.S. Cl. ........................ 324/766; 324/752; 324/765
[58] Field of Search .................................. 324/765, 766, 324/767, 752, 750, 719

[56] References Cited

U.S. PATENT DOCUMENTS

| | | | |
|---|---|---|---|
| 2,859,407 | 11/1958 | Henisch | 324/765 |
| 3,805,160 | 4/1974 | Philbrick et al. | 324/765 |
| 3,890,564 | 6/1975 | Watanabe et al. | 324/40 |
| 3,939,415 | 2/1976 | Terasawa | 324/767 |
| 4,015,203 | 3/1977 | Verkuil | 324/158 D |
| 4,286,215 | 8/1981 | Miller | 324/765 |
| 4,949,034 | 8/1990 | Imura et al. | 324/158 R |
| 5,047,713 | 9/1991 | Kirino et al. | 324/752 |
| 5,081,414 | 1/1992 | Kusama et al. | 324/767 |
| 5,179,333 | 1/1993 | Washizuka et al. | 324/158 R |
| 5,406,214 | 4/1995 | Boda et al. | 324/765 |
| 5,430,376 | 7/1995 | Viertl | 324/227 |
| 5,451,886 | 9/1995 | Ogita et al. | 324/767 |
| 5,453,703 | 9/1995 | Goldfarb | 324/765 |
| 5,459,408 | 10/1995 | Chen | 324/760 |
| 5,488,305 | 1/1996 | Bloom et al. | 324/537 |
| 5,514,337 | 5/1996 | Groger et al. | 422/82.08 |

OTHER PUBLICATIONS

"Simple Contactless Method for Measuring Decay Time of Photoconductivity in Silicon," Lichtenstein and Willard, Jr., *Department of Physics, Rensseiaer Polytechnic Institute*, Troy, N.Y., pp. 133–134, (Sep. 1996).

"Minority–Carrier Lifetime in III–V Semiconductors," Ahrenkiel, *Semiconductors and Semimetals*, vol. 39, Academic Press, Inc., pp. 39–150, (1993).

"Contactless Measurement of Carrier Lifetime in Silicon Thick Wafers," Maekawa, Yamagishi, and Inoue, *Jpn. J. Appl. Phys.*, vol. 32, pp. 5740–5747,(1993).

"Determination of Surface Recombination Velocity and Bulk Lifetime in Detector Grade Silicon and Germanium Crystals," Derhacobian, Fine, Walton, Wong, Rossington, and Luke, *IEEE Transactions on Nuclear Science*, vol. 41, No. 4, pp. 1026–1030, (Aug. 1994).

Defect Monitoring and Control for Crystalline Silicon Processing, M'saad, Norga, Michel, and Kimerling, AIP Conference Proceeding, vol. 306, *Am. Institute of Physics Press* (1994).

"Ultra–High Frequency Photoconductive Decay for Measuring Recombination Lifetime in Silicon," Ahrenkiel, AIP Conference Proceeding, vol. 353, *Am. Institute of Physics Press* (1996).

"Contactless Measurement of Bulk Carrier Lifetime in Thick Silicon Wafers by an Induced Eddy Current," Maekawa, Fujiwara, and Yamagishi, *Semicond. Sci. Technol.*, vol. 10, pp. 18–24 (1995).

*Primary Examiner*—Ernest F. Karlsen
*Attorney, Agent, or Firm*—Ken Richardson

[57] ABSTRACT

An apparatus for determining the minority carrier lifetime of a semiconductor sample includes a positioner for moving the sample relative to a coil. The coil is connected to a bridge circuit such that the impedance of one arm of the bridge circuit is varied as sample is positioned relative to the coil. The sample is positioned relative to the coil such that any change in the photoconductance of the sample created by illumination of the sample creates a linearly related change in the input impedance of the bridge circuit. In addition, the apparatus is calibrated to work at a fixed frequency so that the apparatus maintains a consistently high sensitivity and high linearly for samples of different sizes, shapes, and material properties. When a light source illuminates the sample, the impedance of the bridge circuit is altered as excess carriers are generated in the sample, thereby producing a measurable signal indicative of the minority carrier lifetimes or recombination rates of the sample.

30 Claims, 14 Drawing Sheets

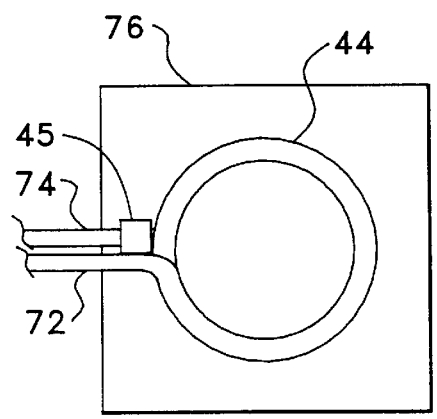
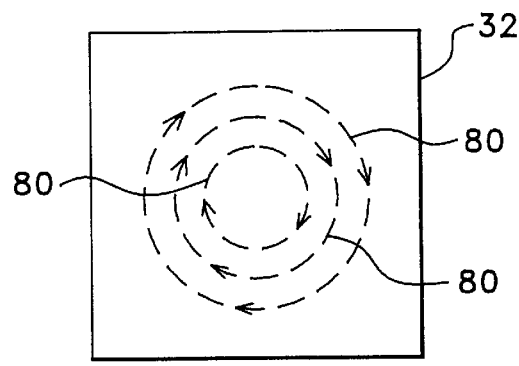
FIG. 4  FIG. 5
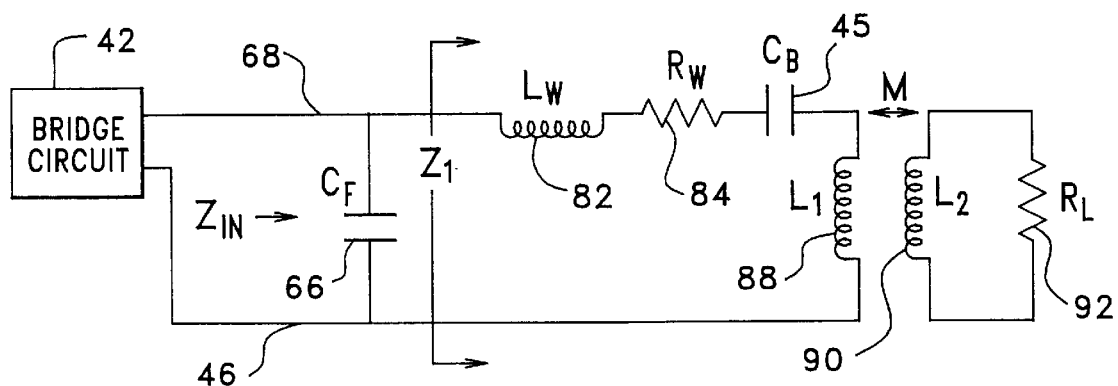
FIG. 6

APPARATUS FOR MEASURING MINORITY CARRIER LIFETIMES IN SEMICONDUCTOR MATERIALS

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

This invention relates to the field of semiconductors and, more specifically, to a method and apparatus for measuring minority carrier recombination lifetimes of semiconductor materials.

2. Description of the Prior Art

Semiconductors are solid crystalline materials that are less conductive of electricity than conductors, but more conductive than insulators. Semiconductors may be comprised of single elements or compounds of multiple elements. Silicon and germanium are well known examples of elemental semiconductor materials while indium phosphide and gallium arsenide are examples of compound semiconductors.

Electrons in outer shells of atoms in conductive materials, such as metals, are not bound to specific atoms and float freely from atom to atom, so such materials conduct electric current readily, whereas electrons in outer shells of atoms in insulator materials are tightly bound to their respective atoms so that they do not conduct electric current. The ability of a semiconductor material to conduct electricity is a result of the semiconductor having negatively charged electrons and vacant electron energy states—election "holes" that behave as though they are positively charged particles near the top of an energy band. Quantum states occupied by electrons can create charge carriers with negative charges that behave as a negatively charged free particles. The positively charged holes are quantum energy states in the semiconductor material with an absence of negatively charged free particles or electrons. When an electron and a hole combine, the net charge is zero. When an electric voltage is applied across a piece of semiconductor material, a positive end of the semiconductor and a negative end of the semiconductor material are established. The externally applied electric voltage causes electrons to travel between the atoms in the semiconductor material from the negative end of the semiconductor material to the positive end of the semiconductor material, while the "holes" travel conversely in the opposite direction. The electrons and holes are referred to as charge carriers because they provide the means of charge flow, or electric current. When a voltage is applied across a piece of semiconductor material, electrons drift toward the positive end of the semiconductor and the holes drift toward the negative end of the semiconductor material.

The flow of electric current in a semiconductor can be described as motion by both electrons or holes. The semiconductor material may be "doped" by the addition of a chemical impurity to increase the number of holes or electrons. The impurities producing electrons are called donors and the impurities producing holes are called acceptors. When chemical doping is performed, the generated particle, electron or hole, is called the majority carrier. The less populous particle is called the minority carrier.

When a sample of semiconductor material is in equilibrium, no external forces such as electric voltages, electric fields, magnetic fields, or temperature gradients are acting on the semiconductor material. When in an equilibrium condition, the semiconductor material is electrically neutral with the net positive charge equal to the net negative charge. Electrons are continually being excited by heat, light, or other energy during equilibrium, however, such that electrons from lower energy bands are excited to higher energy conductor bands where they are move randomly in the semiconductor material. This "generation" of electrons for the conductor bands also generates a concomitant hole for each generated electron. Simultaneously, an electron moving randomly through the semiconductor material may come into close proximity to a hole and recombine with the hole, thus annihilating the hole. Since the net concentrations of holes and electrons in a sample of semiconductor material at equilibrium remain constant, the rate at which electron and hole pairs are generated and the rate at which they recombine must be equal.

Any deviation from equilibrium will change the electron and hole concentrations in a semiconductor to new levels. Deviation from equilibrium can be created by a net input of energy, for example, by applying an electric voltage across the semiconductor, directing light onto the semiconductor, or increasing the temperature of the semiconductor, which will increase the concentrations or densities of excess electrons and holes in the semiconductor, or by creating or allowing a net output of energy by allowing recombinations to occur without creating new electron-hole pairs at a rate equal to the recombination rate. The excess charge carriers generated by such energy input create additional electric current flowing through the semiconductor, while deletion of charge carriers by recombination inhibits electric current flow.

When sufficient energy from an external source or stimulus is applied to the semiconductor material to increase the generation of electrons and holes to a rate that is greater than the rate of recombination of electrons and holes, the population or density of electrons and holes increases until the semiconductor material reaches a new equilibrium point. The electric current carrying capacity of the semiconductor material is proportional to the densities of the electrons and holes. Therefore, increasing the densities of electrons and holes in the semiconductor material in the presence of a voltage will increase electric current flowing in of the semiconductor material.

After removal of the external energy source or stimulus from the semiconductor material the rate of recombination of electrons and holes will be greater than the rate of generation of electrons and holes until equilibrium in the semiconductor is reached. However, the semiconductor's return to its equilibrium condition will not be instantaneous. Rather, a period of time will elapse while recombination of electrons and holes occurs before the semiconductor material reaches its original equilibrium condition. During this period of time after the external energy source or stimulus to the semiconductor material has been removed and before the semiconductor material has returned to its equilibrium condition, the remaining excess charge carriers allow semiconductor to continue to conduct electricity. Thus, the longer the time period it takes a semiconductor material to return to its equilibrium condition after the externally applied energy source or stimulus is removed, the longer the semiconductor material will conduct electricity after the externally applied stimulus is removed. This important characteristic of a semiconductor is known as the semiconductor's recombination rate or minority-carrier lifetime.

Many prior art devices exist to measure a semiconductor material's minority carrier lifetime. For example, U.S. Pat. No. 5,453,703 issued to Goldfarb and U.S. Pat. No. 5,406,214 issued to Boda et al., each disclose a method or apparatus for measuring minority carrier lifetimes of semiconductor materials. Goldfarb uses a capacitance-coupling technique to measure minority-carrier recombination velocity on the surface of semiconductor materials. Unfortunately, Goldfarb's disclosed method is not suitable for testing an entire sample of semiconductor material (i.e., a bulk sample). Boda et al. measure the microwave energy reflected from holes and electrons in the specimen under test to determine minority carrier lifetimes in semiconductors. Unfortunately, the use of reflected microwaves to measure minority carrier lifetimes creates inherent limitations that limit the use of the disclosed method and apparatus, such as being limited to high resistivity samples that prevent the lifetime measurement for highly conducting materials. Other prior art devices and methods used do not provide reliable linear outputs. Therefore, such prior art devices are not accurate consistently when testing samples of different shapes, sizes, and other properties. Furthermore, such prior art devices are not always sensitive so they can not always produce measurable output signals from which the minority carrier lifetime of a sample being tested can be determined. Thus, despite the state of the art, there remains a need for a non-destructive, contact-free system for measuring minority carrier lifetimes in semiconductor materials accurately and with reliable linearity and sensitivity.

SUMMARY OF THE INVENTION

Accordingly, it is a general object of the present invention to provide apparatus and methods for measuring the minority carrier lifetimes and excess carrier recombination rates of semiconductor materials.

It is another general object of the present invention to provide apparatus and methods for accurately measuring minority carrier lifetimes and excess carrier recombination rates of semiconductor materials.

It is another object of the present invention to provide apparatus and methods for measuring minority carrier lifetimes and excess carrier recombination rates of semiconductor materials with consistent high sensitivity.

It is still another object of the present invention to provide apparatus and methods for measuring the minority carrier lifetimes and excess carrier recombination rates of semiconductor materials with consistent, accurate results for materials of different sizes, shapes, and other material properties.

It is yet another object of the present invention to provide apparatus and methods for the contactless measurement of minority carrier lifetimes and excess carrier recombination rates of semiconductor materials.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the apparatus of the present invention includes a bridge circuit having three resistive arms and one arm connected to a capacitor in parallel with a wire coil. An oscillator provides the bridge circuit with a high frequency voltage signal. A sample to be tested is positioned near the coil such that a variable mutual inductance is created between the sample and the coil. After the dark conductivity or null darkness effects of the sample are negated by balancing the bridge circuit, a laser or other light source illuminates the sample, which creates a measurable imbalance in the bridge circuit that is indicative of the excess carrier density of the sample under test. The decay of the excess carrier density is called the carrier recombination lifetime. The sample is preferably positioned near the coil such that the illumination of the sample creates a linearly related change in the impedance of the bridge circuit.

To further achieve the foregoing and other objects in accordance with the purposes of the present invention, as embodied and broadly described herein, the method of the present invention includes applying an input voltage signal to two nodes of a bridge circuit, wherein three branches of the bridge circuit include resistive elements and a fourth branch includes a capacitive element in parallel with a coil; positioning a sample of semiconductor material in proximity to the coil; balancing the bridge circuit by adjusting the mutual inductance between the sample and the coil; illuminating the sample; and measuring an output voltage signal from the bridge circuit.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings:

FIG. 4 is plan view of the coil and block of FIG. 3 taken along the line 4—4 of FIG. 3;

FIG. 5 is plan view of a semiconductor sample illustrating the electric eddy currents induced in the sample when the sample is illuminated with the semiconductor photoconductive decay measuring apparatus of FIG. 1;

FIG. 6 is an electric circuit model schematic diagram of the photoconductive decay measuring apparatus of FIG. 1;

DETAILED DESCRIPTION OF THE PREFERRED EMBODIMENTS

Figure 1:
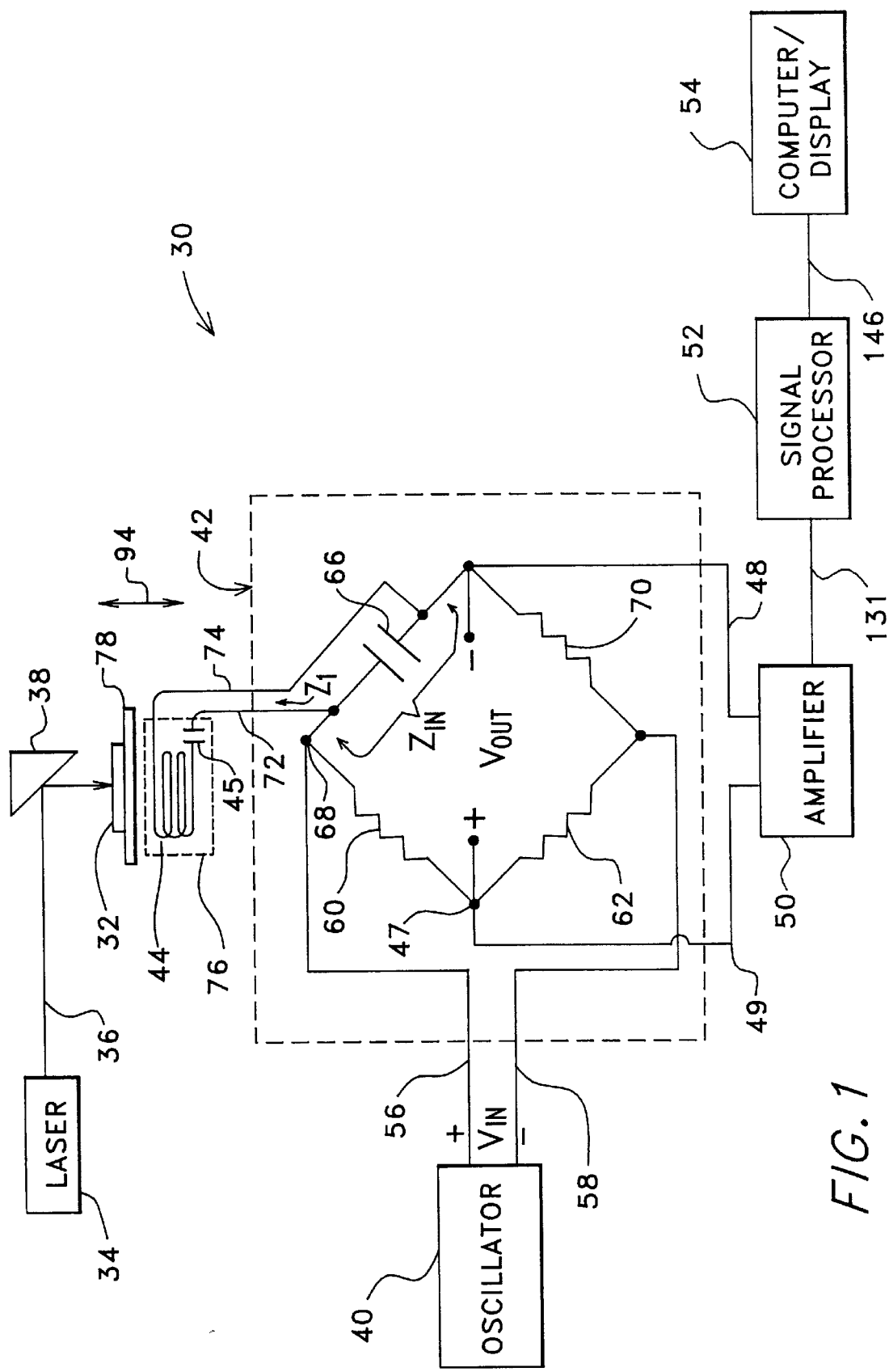
FIG. 1 is a diagrammatic representation of the semiconductor photoconductive decay measuring apparatus of the present invention.

The semiconductor photoconductive decay measuring apparatus 30 for measuring minority carrier lifetime of a semiconductor sample 32 is illustrated schematically in FIG. 1 and includes a laser or other light source 34 for creating and directing a light beam 36 to illuminate the semiconductor sample 32 after the light beam 36 is deflected by a prism mirror, or other deflector 38. The light source 34 may also be positioned such that it directs the beam 36 directly onto the sample 32 with reflection or deflection by the deflector 38. An oscillator 40 connected to a bridge circuit 42 generates an electric current in a coil 44, which is positioned adjacent the semiconductor sample 32, for electromagnetically coupling the semiconductor sample 32 and the coil 44. When the laser or other light source 34 illuminates the semiconductor sample 32 with a pulse of light, the sample 32 will generate excess electrons and holes, thereby altering the photoconductance $G_L$ of the sample 32 and, as a result, also altering the electrical impedance characteristics of the bridge circuit 42. As will be discussed in more detail below, a capacitor 45 is preferably connected in series with the coil 44.

When the illumination of the sample 32 by the laser or other light source 34 ends, the excess electrons and holes in the sample 32 will begin to recombine at a faster rate than the rate of generation of excess electrons and holes in the sample 32. As a result of such recombination, the electrical impedance characteristics of the bridge circuit 42 will change such that a measurable voltage signal $V_{OUT}$ indicative of the minority carrier lifetime or recombination characteristics of the semiconductor sample 32 can be detected and measured between the nodes 46, 47 of the bridge circuit as the excess electrons and holes in the semiconductor sample 32 recombine and the sample 32 returns to an equilibrium state. The apparatus 30 is preferably enclosed in a chamber or other enclosure or room, or is otherwise configured, such that the only illumination of the sample 32 is created by the light source 34.

The nodes 46, 47 are connected to the leads 48, 49, respectively, which are connected to an amplifier 50 to amplify the detected high frequency voltage $V_{OUT}$ of the bridge circuit 42. A signal processor 52 removes the unwanted portion of the amplified voltage signal $V_{OUT}$ created by the amplifier 50, and a computer/display device 54 displays or stores the measured signal from the signal processor 52. The voltage signal displayed on the computer/display device 54 is indicative of the minority carrier lifetime or recombination rates of the semiconductor sample 32, as will be discussed in more detail below. The sample's 32 minority carrier lifetime or recombination characteristics may vary over time and may be different for different portions of the sample 32. Furthermore, many different methods and algorithms can be used to determine the different characteristics from the portion of the voltage signal $V_{OUT}$ indicative of the characteristics is generated from the voltage signal $V_{OUT}$.

A significant advantage of the measuring apparatus 30 of this invention is that the apparatus 30 provides for the contactless measurement of the minority carrier lifetime or recombination rates of semiconductor samples and provides consistently accurate results for semiconductor samples of different shapes, sizes, and properties, including samples that have not been measurable by prior art systems, as will also be discussed in more detail below. In order to obtain such consistently accurate results, the apparatus 30 has both linearity and sensitivity. With linearity, the change in the electrical impedance characteristics of the apparatus 30 will be linearly related to the pulse of illumination from the laser 34. More specifically, the sample 32 is positioned in the apparatus 30 such that the input impedance $Z_{IN}$ prior to illumination of the sample 32 remains approximately constant for samples of different sizes, shapes, and material properties, and such that the change in the input impedance $Z_{IN}$ after illumination of the sample 32 is linearly related to the change in photoconductance $G_L$ of sample 32, as will be discussed in more detail below. With sensitivity, the apparatus 30 generates a measurable voltage signal $V_{OUT}$ for semiconductor samples having many different sizes, shapes, and material properties.

The oscillator 40 generates a high frequency electric voltage signal $V_{IN}$ on the leads or terminals 56, 58 that has an oscillator frequency $f_o$ that is preferably constant during testing of samples and typically in a range between 400 megahertz (MHz) and 460 megahertz (MHz). Optimally, the oscillator 40 generates an oscillator frequency $f_o$ that is approximately 420–430 megahertz. The peak-to-peak amplitude of the voltage signal $V_{IN}$ is approximately ten volts. The oscillator 40 supplies the voltage signal $V_{IN}$ to the bridge circuit 42 at the nodes 68, 70. The bridge circuit 42 includes the resistors 60, 62, 64 and the capacitor 66 ($C_F$). The resistors 60, 62, 64 preferably have equal values and can be, for example, fifty ohms or two-hundred ohms each. The capacitor 66 ($C_F$) preferably has a value of approximately twenty picofarads but can be set to many different values. The input terminals 56, 58 are connected to the nodes 68, 70, respectively, of the bridge circuit 42. The bridge circuit 42 includes an electrical connection to the coil 44 with the leads 72, 74 such that the coil 44 forms part of the bridge circuit 42. The leads or terminals 72, 74 may actually constitute a coaxial cable or line so as to ensure that the impedance $Z_1$ is equal to the inductive reactance of the coil 44. The capacitor 66 ($C_F$) is configured in parallel with the coil 44 and the capacitor 45 ($C_B$).

The coil 44 may be encased in a block 76 of material such as, for example, Lucite™ material, to protect and immobilize the coil 44 and to help maintain the proper positioning of the coil 44 relative to the semiconductor sample 32. In addition, the sample 32 may be positioned on a dielectric slide 78 in order to protect the coil from laser or light damage. The capacitor 45 ($C_B$) is preferably embedded in the block 76 to prevent damage to the capacitor 45 ($C_B$).

Figure 2:
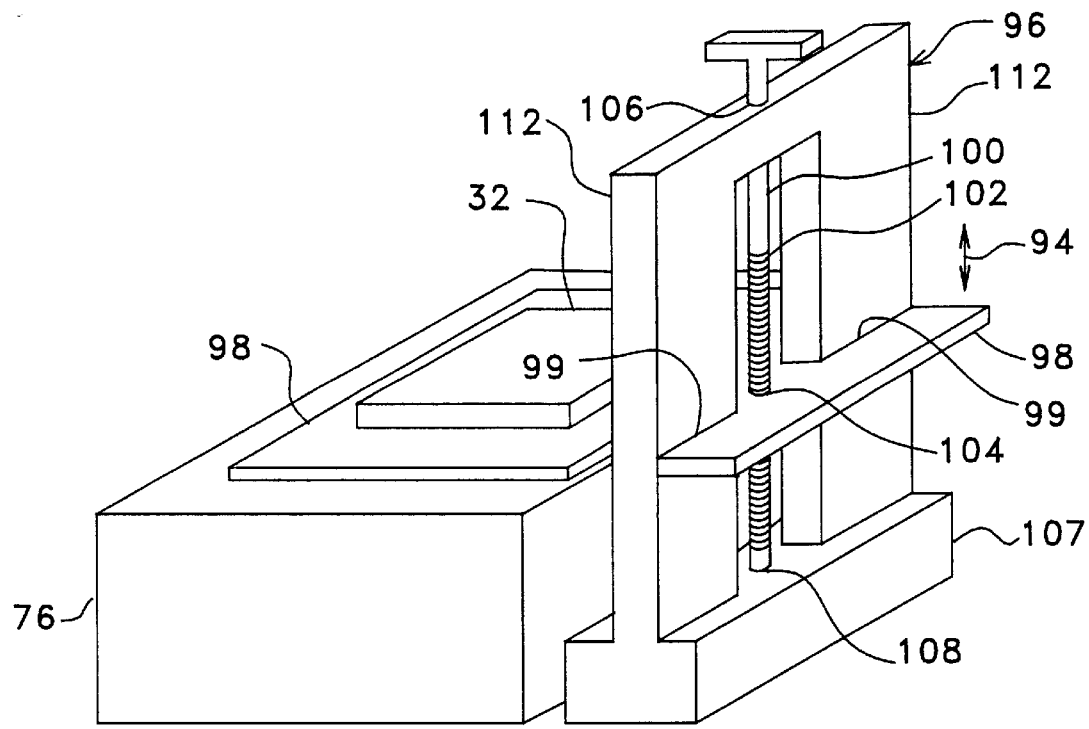
FIG. 2 is an isometric diagrammatic view of a positioner and block used in the apparatus of FIG. 1 to position a semiconductor sample in the apparatus.
Figure 3:
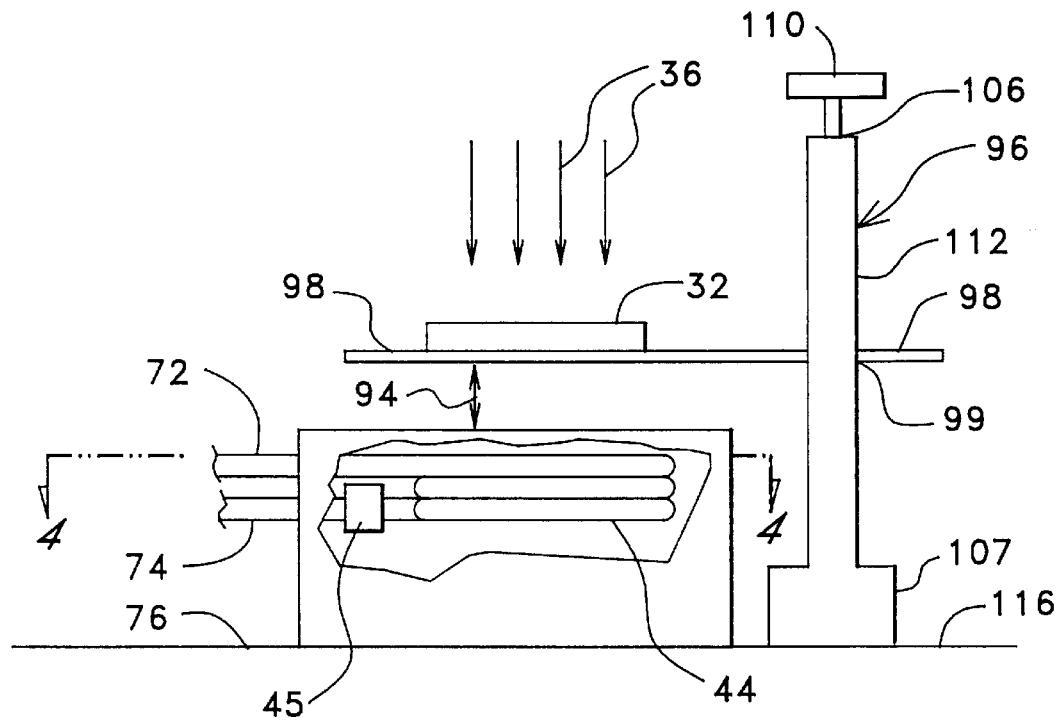
FIG. 3 is an elevation view of the positioner and block of FIG. 2 with a portion of the block shown cut away to reveal the coil positioned inside the block.

An important feature of the apparatus 30 is that the sample 32 can be moved relative to the coil 44, as indicated by the arrow 94 in FIGS. 1–3. A simple positioning device for the sample 32 is illustrated diagrammatically in FIGS. 2 and 3 although any apparatus that can support and move the sample 32 in relation to the coil 44 would be satisfactory for this invention. For purposes of illustration of the location of the coil 44 and the capacitor 45 within the block 76, but not limitation, the block 76 shown in FIG. 3 is presumed to be made of clear Lucite™ material such that the coil 44 and the capacitor 45 are visible inside the block 76. Similarly, the portion of the block 76 shown in FIG. 4 is also presumed to be made of clear Lucite™ material such that the coil 44 and the capacitor 45 ($C_B$) are visible inside the block 76. The block 76 does not, however, need to comprise a clear material and may comprise materials other than Lucite™ material.

Now referring to FIGS. 2 and 3 simultaneously, the sample 32 is positionable relative to the coil 44 (concealed by the block 76 in FIG. 2) and the block 76 by the positioner 96. The positioner 96 includes the platform 98 upon which the sample 32 is positioned and supported. The platform 98 may constitute the dielectric slide 78 previously discussed above or may be in addition to the dielectric slide 78. The platform 98 includes two slots 99 that fit snugly about the walls 112 so as to guide or direct the platform 98 during upward or downward movement of the platform 98 in relation to the coil 44 and to prevent tilting or shifting of the platform 98.

The positioner 96 includes a rod 100 (not shown in FIG. 3) that is journaled in hole 106 at one end and in hole 108 at the other end and has external threads 102 extending along a length of the midsection of rod 100. The external threads 102 on the rod 100 mate with internal threads (not shown) located on the inside of the bore 104 of the platform 98 to raise and lower the platform as the rod is rotated. The rod cap 110 allows the rod 100 to be rotated clockwise or counterclockwise, thereby causing the platform 98 to move up or down, respectively, which in turn allows the sample 32 to move up or down relative to the block 76 and the coil 44.

The thickness of the platform 98 and the wall 112, and the diameter of the rod 100, should be sufficiently large to prevent the platform 98 from tilting or otherwise being unsteady or non-level. The base 107 should also be of sufficient weight and dimension to ensure that the positioner 96 is stable on the surface 116. While the positioner 96 is provided as an illustrative example of how the sample 32 can be positioned and moved relative to the coil 44 and the block 76, persons of skill in this art will be aware of other positioning systems or devices that can be used with the apparatus 30 to move and position the sample 32 relative to the coil 44 and the block 76. Therefore, many different types of positioners, including both manually operated and electrically operated positioners, can be used in the apparatus 30 and the specific structure of the positioner 96 disclosed herein facilitates, but does not constitute, the invention.

As discussed briefly above, it is believed, although not known for certain, that illuminating the semiconductor sample 32 with the light beam 36 may induce eddy currents 80 (see FIG. 5) of electricity in the semiconductor sample 32, which eddy currents would generate a magnetic field perpendicular to the eddy currents 80 and, as a result, may create a mutual inductance between the sample 32 and the coil 44. Such mutual inductance, it is believed, can alter the photoconductance $G_L$ of the sample 32 and, as a result, also alter the electrical characteristics of the bridge circuit 42 to create a voltage signal $V_{OUT}$ at the nodes 46, 47. Regardless of whether this hypotheses and explanation is completely correct, it is known from empirical testing and observations that the voltage signal $V_{OUT}$ is indicative of the minority carrier lifetimes or recombination rates of the semiconductor sample 32, as will be discussed in more detail below. In order to provide a detailed explanation of the apparatus 30 of the present invention and of the change in electrical impedance of the bridge circuit 42 caused by the illumination of the sample 32, it is useful to use an electric circuit model of the apparatus 30, as illustrated in FIG. 6.

In order to model the electrical characteristics of the apparatus 30 shown in FIG. 1, the coil 44, the sample 32, the wires 72, 74 and other components of the apparatus 30 are represented by electrical components, such as resistors and inductors, that provide an accurate simulation of each of the coil 44, sample 32, wires 72, 74, and other components of the apparatus 30. For example, in the electrical circuit model of FIG. 6, the inductor 82($L_w$) and the resistor 84 ($R_W$) represent the distributed inductance and ohmic resistance, respectively, of the wires or leads 72, 74 to the coil 44 shown in FIG. 1 and of the remainder of the circuit shown in FIG. 1. The resistor 84 ($R_W$) in FIG. 6 is the distributed electrical resistance of the connecting cables, wire, and inductor 88 ($L_1$) in FIG. 6 represents the self inductance of the coil 44 of FIG. 1. The inductor 90 ($L_2$) in FIG. 6 represents the self inductance of the semiconductor sample 32 when eddy currents 80 are created within the sample 32. The resistor 92 ($R_L$) represents the resistance of the semiconductor sample 32 and is a function of the sample's 32 conductivity and physical dimensions. For example, the ohmic resistance of a rectangular semiconductor sample having width W and cross-sectional area A is given by the following equation:

$$R_L = \frac{W}{qnuA} \tag{1}$$

where q is the electric charge of an electron measured in coulombs, n is the carrier electron concentration of the sample 32 measured per cubic centimeters ($cm^{-3}$), and u is the carrier mobility of the sample 32 measured in centimeters squared per volt-second ($cm^2$/vs).

As previously discussed above, the capacitor 45 ($C_B$) is preferably embedded in the block 76 and is connected in electrical series with the coil 44. Therefore, the capacitor 45($C_B$) is in series with the inductor 88($L_1$), in the circuit model shown in FIG. 6. While the capacitor 45 ($C_B$) can be variable, its value is fixed prior to the capacitor 45 ($C_B$) being embedded in the block 76. The capacitor 45 forms a series resonant circuit with the inductor 88 ($L_1$) in order to reduce the circuit reactance created by the inductor 88 ($L_1$) and improve the sensitivity of the coil 44. More specifically, the voltage level produced across the leads 72, 74 by the coil 44 is related to the number of turns in the coil 44 such that increasing the number of turns in the coil 44 increases the voltage level produced by the coil 44. Unfortunately, increasing the number of turns in the coil 44 undesirably increases the reactance provided in the circuit model by the inductor 88 ($L_1$). The capacitor 45 allows the number of turns in the coil 44 thereby increasing the value of the inductor 88 ($L_1$), to be increased by reducing the undesirable reactance created as a result of the increased number of turns in the coil 44. The capacitor 45 ($C_B$) preferably has a value of ten to twelve picofarads. When the semiconductor sample 32 is illuminated by the laser or other light source 34 such that eddy currents 80 flowing in the semiconductor sample 32 are created, additional mutual inductance is created between the coil 44 and the sample 32. With the circuit model shown in FIG. 6 containing the components discussed above, the electrical impedance $Z_1$ is given by the following equation:

$$Z_1 = R_W + j\left[\omega(L_1 + L_W) - \frac{1}{\omega C_B}\right] + R_L\left[\frac{(\omega L_M)^2}{(R_L)^2 + (\omega L_2)^2}\right] - j\omega L_2\left[\frac{(\omega L_M)^2}{(R_L)^2 + (\omega L_2)^2}\right] \quad (2)$$

where $\omega$ is equal to $2\pi f_o$, and $L_M$ represents the mutual inductance between the sample 32 and the coil 44 and is equal to $K_m(L_1 L_2)^{1/2}$ where $K_m$ is the unit-less mutual inductance coupling coefficient. The value for $K_m$ is always greater than or equal to zero and less than or equal to one. The higher the value of $K_m$, the greater the magnetic coupling between the inductors $L_1$ and $L_2$. Given equation (2) for impedance $Z_1$, the input impedance $Z_{IN}$ can be written as:

$$\frac{1}{Z_{IN}} = j\omega C_F + \frac{1}{Z_1} \quad (3)$$

As previously discussed above, in order to obtain an accurate reading of the minority carrier lifetime for the sample 32, the apparatus 30 should possess both linearity in sample photoconductance $G_L$ and sensitivity. In order for the apparatus 30 to obtain linearity, the change in the real portion of the input impedance $Z_{IN}$ must be linear with respect to the change in the photoconductivity $G_L$ of the sample 32 after the sample has been illuminated. Therefore, changes in the photoconductivity $G_L$ of the sample 32 should create a linearly related change in the real portion of the impedance $Z_{IN}$.

In order for the apparatus 30 to obtain sensitivity, the real portion of the impedance $Z_{IN}$ should be maximized. The sensitivity of the measuring apparatus 30 is dependent on the oscillator frequency $f_o$ of the signal produced by the oscillator 40 on the leads 56, 58, as will be discussed in more detail below. The following discussion illustrates how the measuring apparatus 30 achieves both linearity and sensitivity.

The linearity of the apparatus 30 is based on the linear relationship between the impedance $Z_{IN}$ and the photoconductance $G_L$ of the sample 32. From equation (2), the real and reactive components of the impedance $Z_1$ can be grouped as follows:

$$Z_1 = R_W + R_L\left[\frac{(\omega L_M)^2}{(R_L)^2 + (\omega L_2)^2}\right] + j\left[\omega L_1 + \omega L_W - \frac{1}{\omega C_B} - \frac{(\omega L_2)(\omega L_M)^2}{(R_L)^2 + (\omega L_2)^2}\right] \quad (4)$$

In a semiconductor sample 32, the resistance $R_L$ of the sample 32 is significantly larger than the sample's self inductance $\omega L_2$ (i.e., $R_L >> \omega L_2$). Therefore the real part of the impedance $Z_1$ can be expanded using a binomial expansion to obtain the following:

$$Re(Z_1) \text{ approximately equal } R_W + \frac{(\omega L_M)^2}{R_L} - \left(\frac{1}{2}\right)\frac{(\omega L_M)^2(\omega L_2)^2}{(R_L)^3} + \left(\frac{1}{4}\right)\frac{(\omega L_M)^2(\omega L_2)^4}{(R_L)^5}\ldots \quad (5)$$

The photoconductivity $G_L$ of the sample 32 is equal to the inverse of the resistance $R_L$ of the sample as follows:

$$G_L = \frac{1}{R_L}. \quad (6)$$

Combining equations (5) and (6) leads to:

$$Re(Z_1) = R_W + (\omega L_M)^2 G_L - (1/2)(\omega L_M)^2(\omega L_2)^2(G_L)^3 \quad (7)$$

Since the photoconductance $G_L$ of the sample 32 is usually extremely small (i.e., generally less than 1.0 ohm$^{-1}$), then even as the photoconductance $G_L$ of the sample 32 varies over many orders of magnitude, if the mutual inductance $L_M$ between the inductors 88, 90 ($L_1$, $L_2$) is kept very small (i.e., the inductors $L_1$, $L_2$ are not too tightly coupled magnetically), the higher order terms of the photoconductance $G_L$ become negligible, and:

$$Re(Z_1) = R_W + (\omega L_M)^2 G_L. \quad (8)$$

Therefore, the real part of the impedance $Z_1$ is linearly related to the photoconductance $G_L$ of the sample 32 when the mutual inductance between the coil 44 and the sample 32 is very small. As a result, the real part of the impedance $Z_{IN}$ is also linearly related to the photoconductance $G_L$ of the sample 32 when the mutual inductance between the coil 44 and the sample 32 is very small, and changes in the photoconductance $G_L$ of the sample 32 will create a linearly related change in the real portion of the input impedance $Z_{IN}$. In addition, it is believed that the term ($\omega L_2$) also decreases non-linearly when the mutual inductance between the coil 44 and the sample 32 is very small, thus also helping make the higher order terms of the sample photoconductance $G_L$ negligible.

The importance and benefits of these linear relationships will now be illustrated in more detail with regard to several specific sample examples. For each of the following examples, the resistors 60, 62, 64 in the bridge circuit 42 are assumed to be fifty ohms each while the capacitor 66 ($C_F$) in the bridge circuit 42 is assumed to be twenty picofarads, although other resistance and capacitance valves can also be used.

Figure 7:
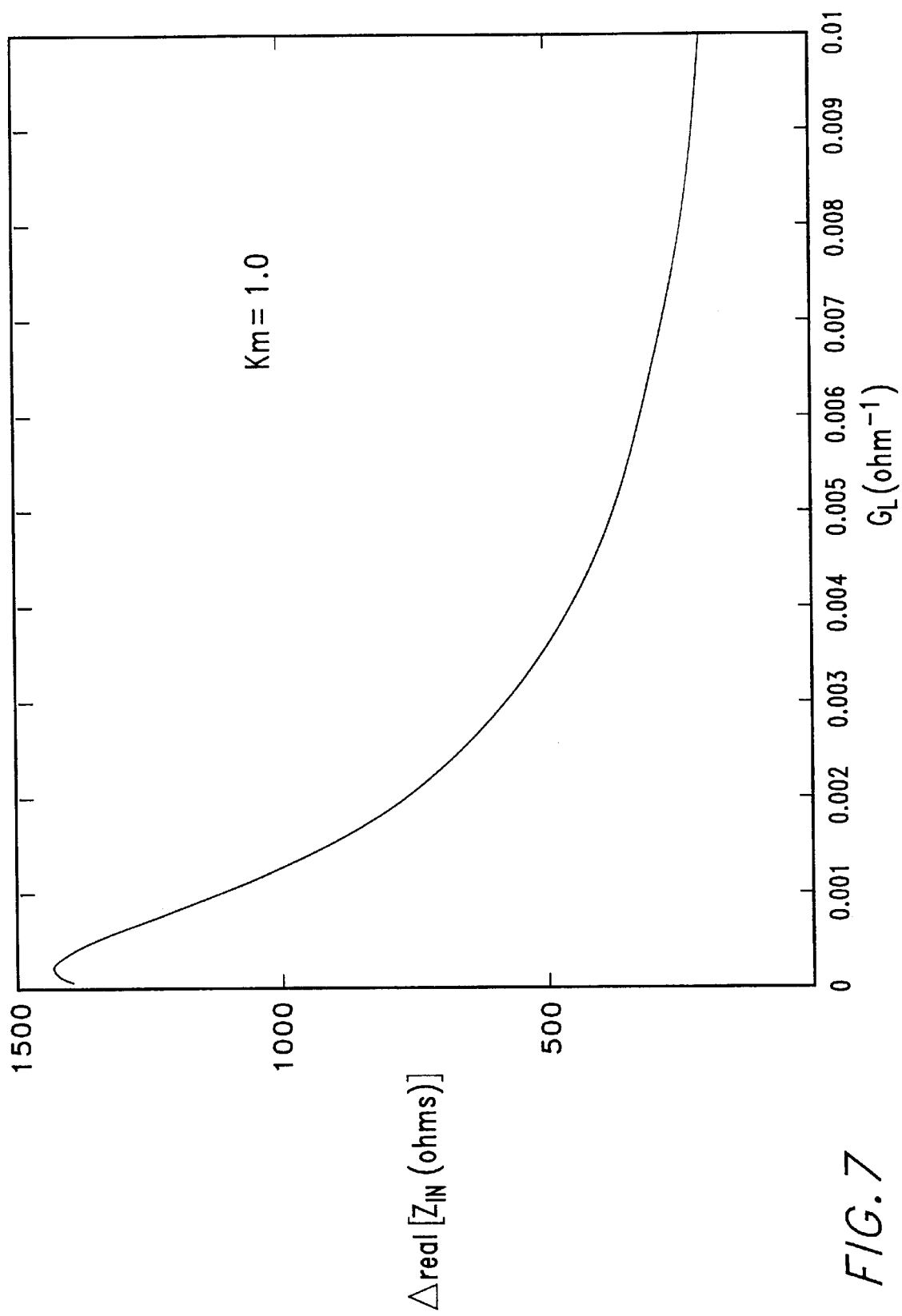
FIG. 7 is a graph of the real portion of the input impedance of the apparatus of FIG. 1 versus sample photoconductance using a mutual inductance coupling coefficient $K_m$ equal to 1.0.

When the mutual inductance $L_M$ between the inductors 88, 90 ($L_1$, $L_2$) is too high, the apparatus 30 does not exhibit either linearity or sensitivity. For example, if the mutual inductance coupling coefficient $K_m$ is equal to one (i.e., the spacing between the inductors $L_1$ and L2 is very small) and the oscillator frequency $f_o$ is equal to 425 MHz, the graph shown in FIG. 7 is obtained for varying values of sample photoconductance $G_L$. The sample 32 used in this example is a simulation of a typical laboratory sample.

Figure 8:
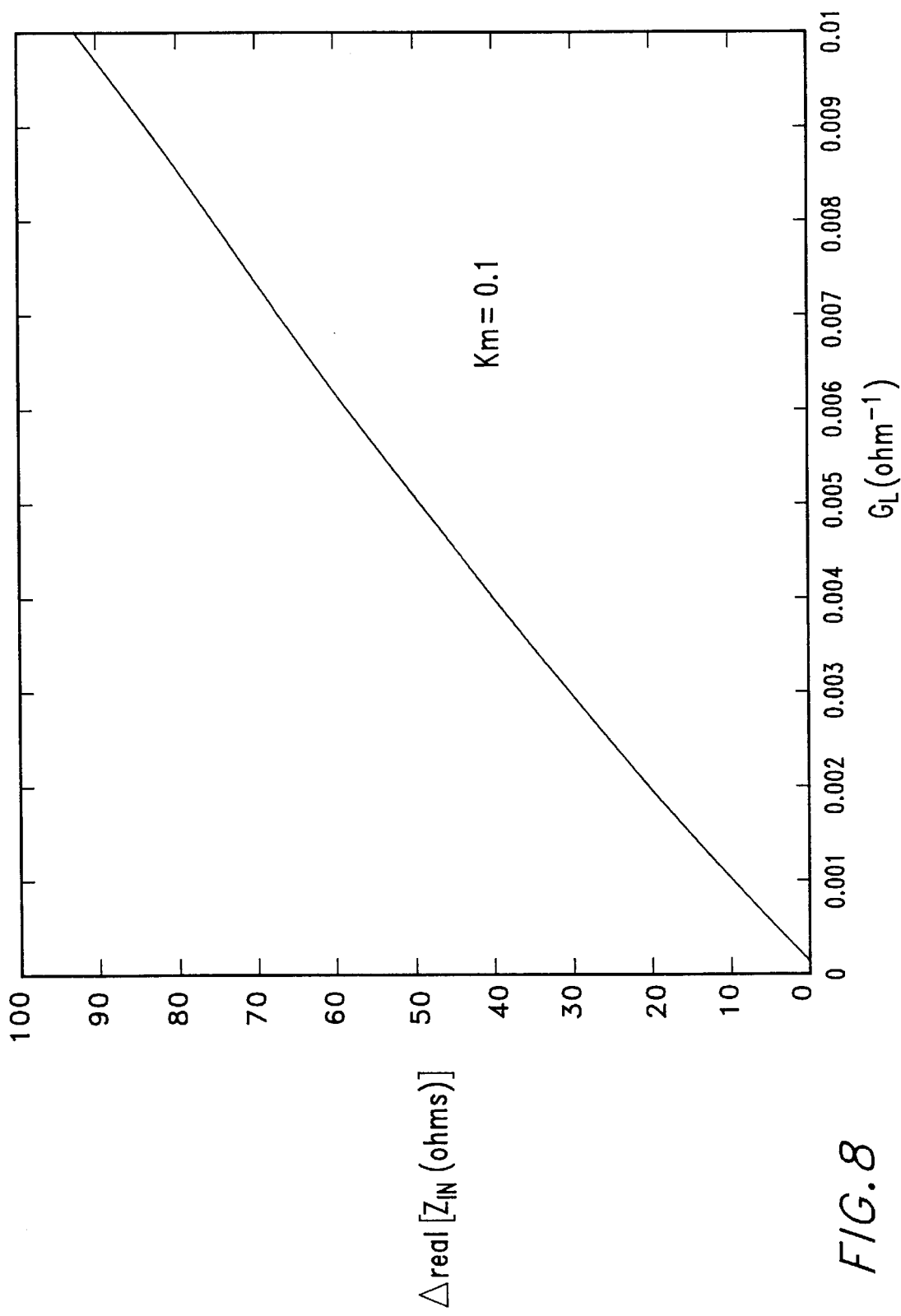
FIG. 8 is a graph of the real portion of the input impedance of the apparatus of FIG. 1 versus sample photoconductance using a mutual inductance coupling coefficient $K_m$ equal to 0.1.
Figure 9:
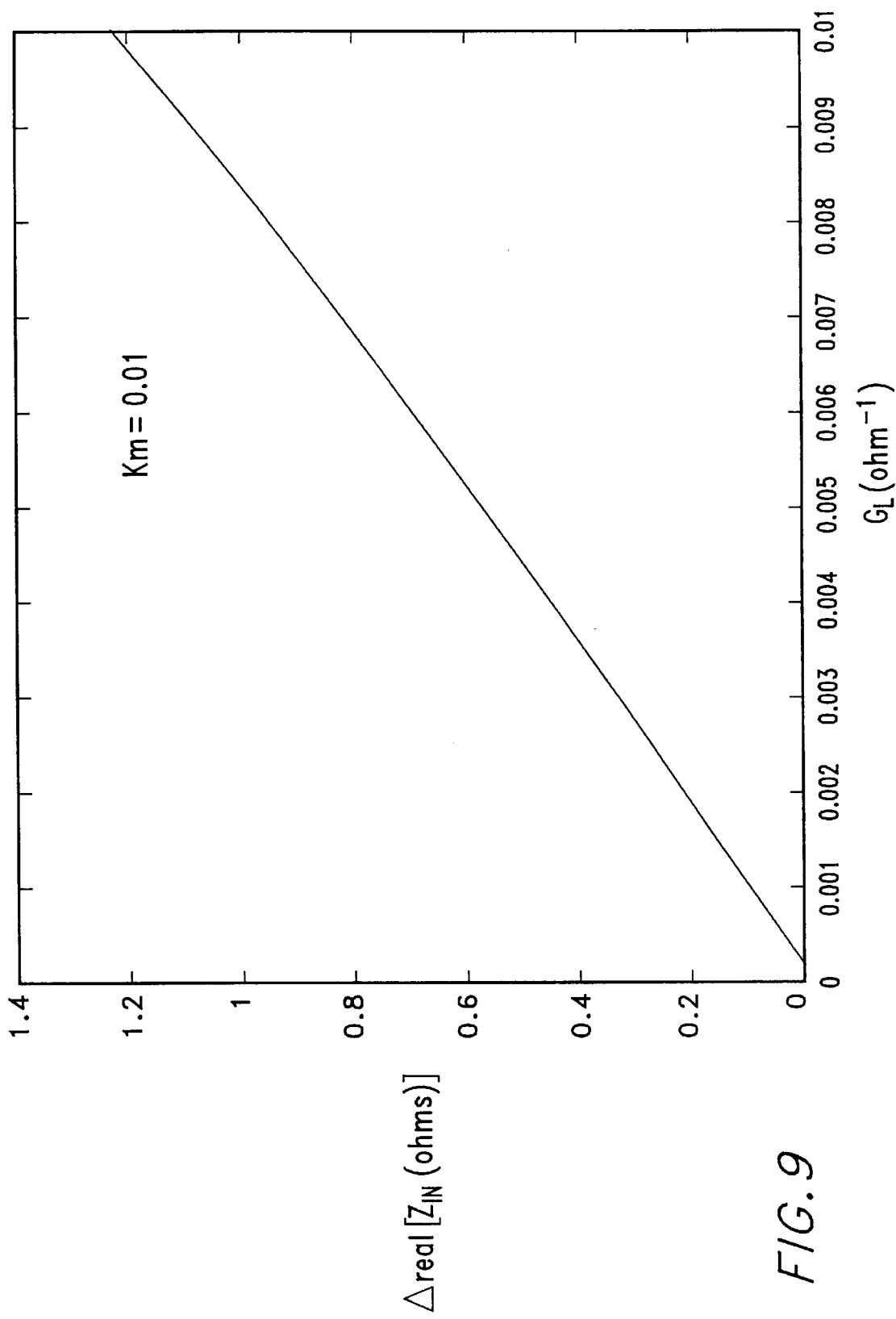
FIG. 9 is a graph of the real portion of the input impedance of the apparatus of FIG. 1 versus sample photoconductance using a mutual inductance coupling coefficient $K_m$ equal to 0.01.

In this example, apparatus 30 does not possess linearity since the real portion of the input impedance $Z_{IN}$ does not increase linearly as the photoconductance $G_L$ of the sample 32 increases. In contrast, if the mutual inductance coupling coefficient $K_m$ is equal to 0.1 (i.e., the spacing between the inductors $L_1$ and $L_2$ is increased) and the oscillator frequency $f_o$ is equal to 425 MHz, the graph shown in FIG. 8 is obtained for a range of values of sample photoconductance $G_L$. In the second example, for the same sample 32 as the first example, the apparatus 30 does display linearity since the real portion of input impedance $Z_{IN}$ increases linearly as the photoconductance $G_L$ of the sample 32 increases. An example of the linearity of the apparatus when the mutual inductance coupling coefficient $K_m$ is 0.01 and the oscillator frequency $f_o$ is 425 MHz for the same sample 32 as the previous two examples is illustrated in FIG. 9. Obviously, in a similar fashion to the example discussed above in relation to FIG. 8, the apparatus 30 displays linearity due to the weak coupling and weak mutual inductance created between the coil 44 (represented by the inductor 88 ($L_1$)) and the sample 32 (represented by the inductor 90 ($L_2$)), which is a result of the weak magnetic coupling between the coil 44 and the sample 32.

Figure 10:
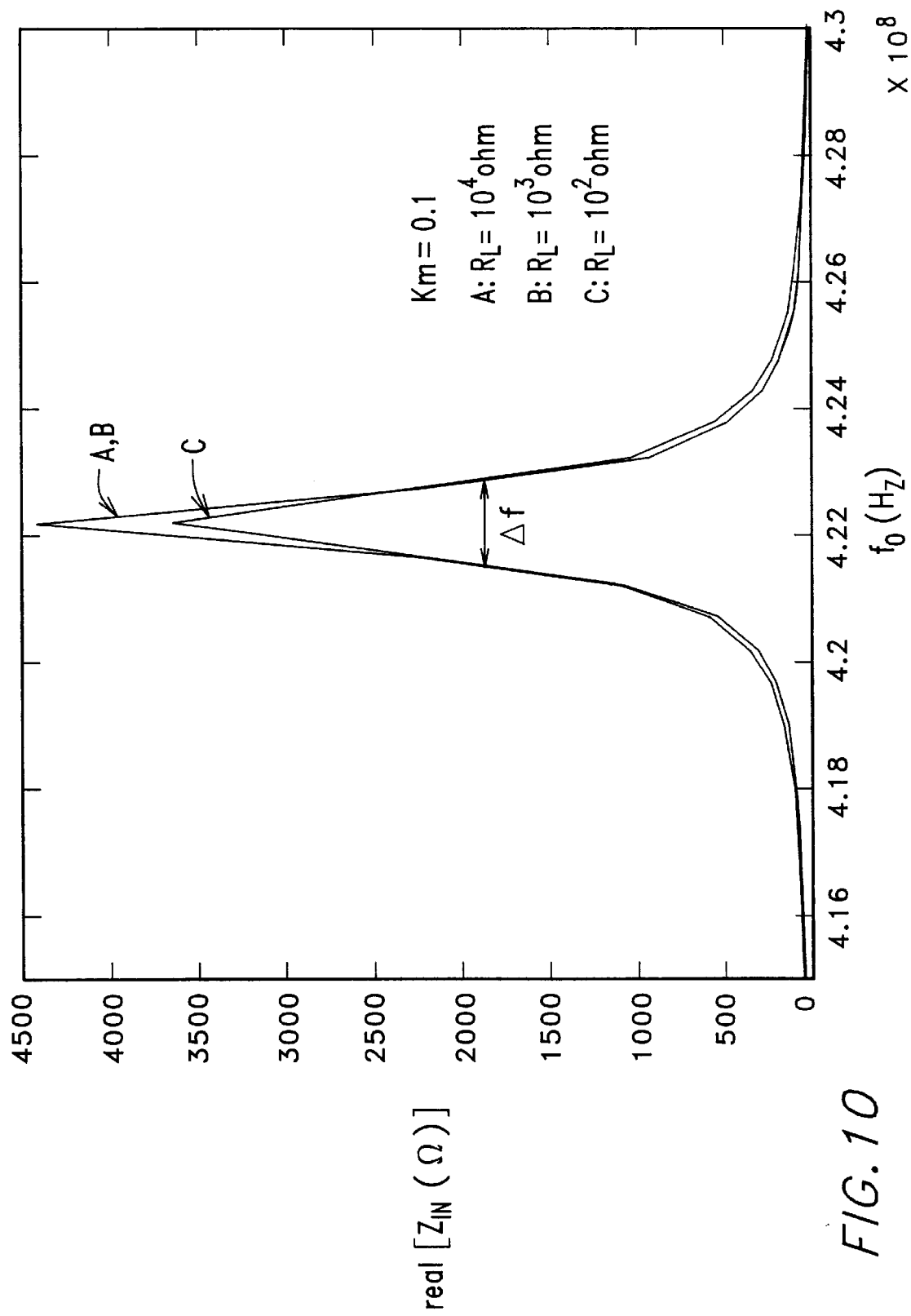
FIG. 10 is a graph of the real portion of the input impedance of the apparatus of FIG. 1 versus oscillator frequency $f_o$ using a mutual inductance coupling coefficient $K_m$ equal to 0.1 for three different values of sample resistance.
Figure 11:
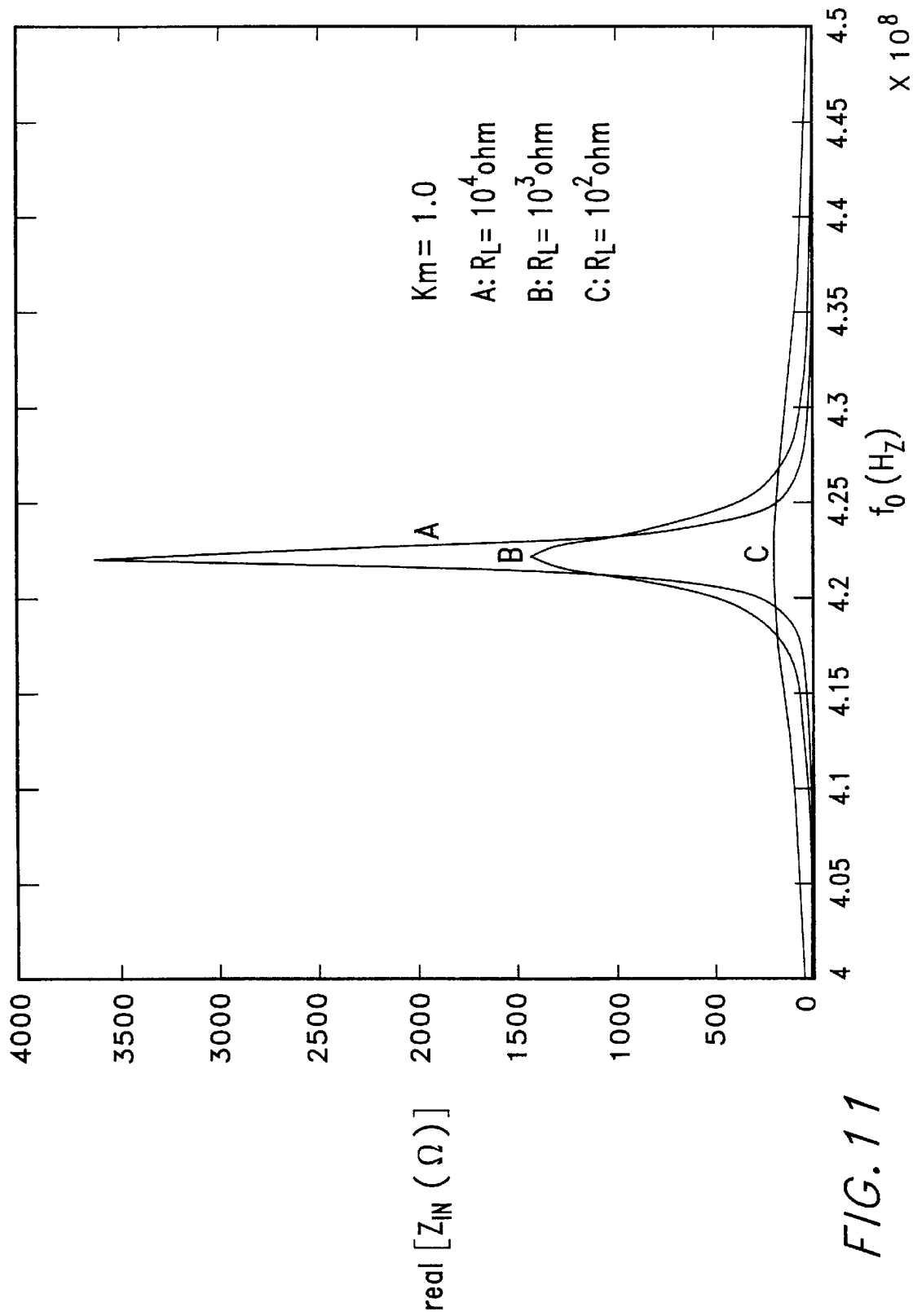
FIG. 11 is a graph of the real portion of the input impedance of the apparatus of FIG. 1 versus oscillator frequency $f_o$ using a mutual inductance coupling coefficient $K_m$ equal to 1.0 for three different values of sample resistance.

As previously discussed above, in order to obtain a high sensitivity for the apparatus 30, a large amplitude, high frequency, output voltage signal $V_{OUT}$ must be obtained between the nodes 46, 47 of the bridge circuit 42 for samples having different sizes, shapes, and material properties. The voltage signal will have a frequency equal to the oscillator frequency $f_o$. The larger the impedance $Z_{IN}$, the larger the amplitude of the output voltage signal $V_{OUT}$. Therefore, maximizing the input impedance $Z_{IN}$ will increase the value of the output voltage signal $V_{OUT}$. More specifically, the sensitivity of the apparatus 30 is proportional to the slope of the input impedance $Z_{IN}$ versus frequency at any particular operating point. For example, now referring to FIG. 10, the curves A, B, C represent different values of the dark resistance $R_L$ of samples 32 for a mutual inductance coupling coefficient $K_m$ equal to 0.1. The curves A, B, C have their maximum slopes at approximately 4.21 MHz and 4.23 MHz. In addition, the curves have approximately equal slopes at these frequencies. Therefore, the apparatus 30 displays high sensitivity for values of the dark resistance $R_L$ of the sample 32 that vary several orders of magnitude. In contrast, when the mutual inductance coupling coefficient $K_m$ is equal to one, the graphs A, B, C shown in FIG. 11 are obtained for the same sample simulations. While graph A in FIG. 11 illustrates relatively good sensitivity, graphs B and C in FIG. 11 display very poor sensitivity for the apparatus 30. Therefore, as illustrated by the previous two examples, if the mutual inductance coupling coefficient $K_m$ is too high, the apparatus 30 will not display the necessary sensitivity consistently for different samples. An important feature of the apparatus 30 is that consistently high sensitivity is created by maintaining a consistently high and relatively constant input impedance $Z_{IN}$ for different samples, as illustrated in FIG. 10, as will be discussed in more detail below.

Figure 12:
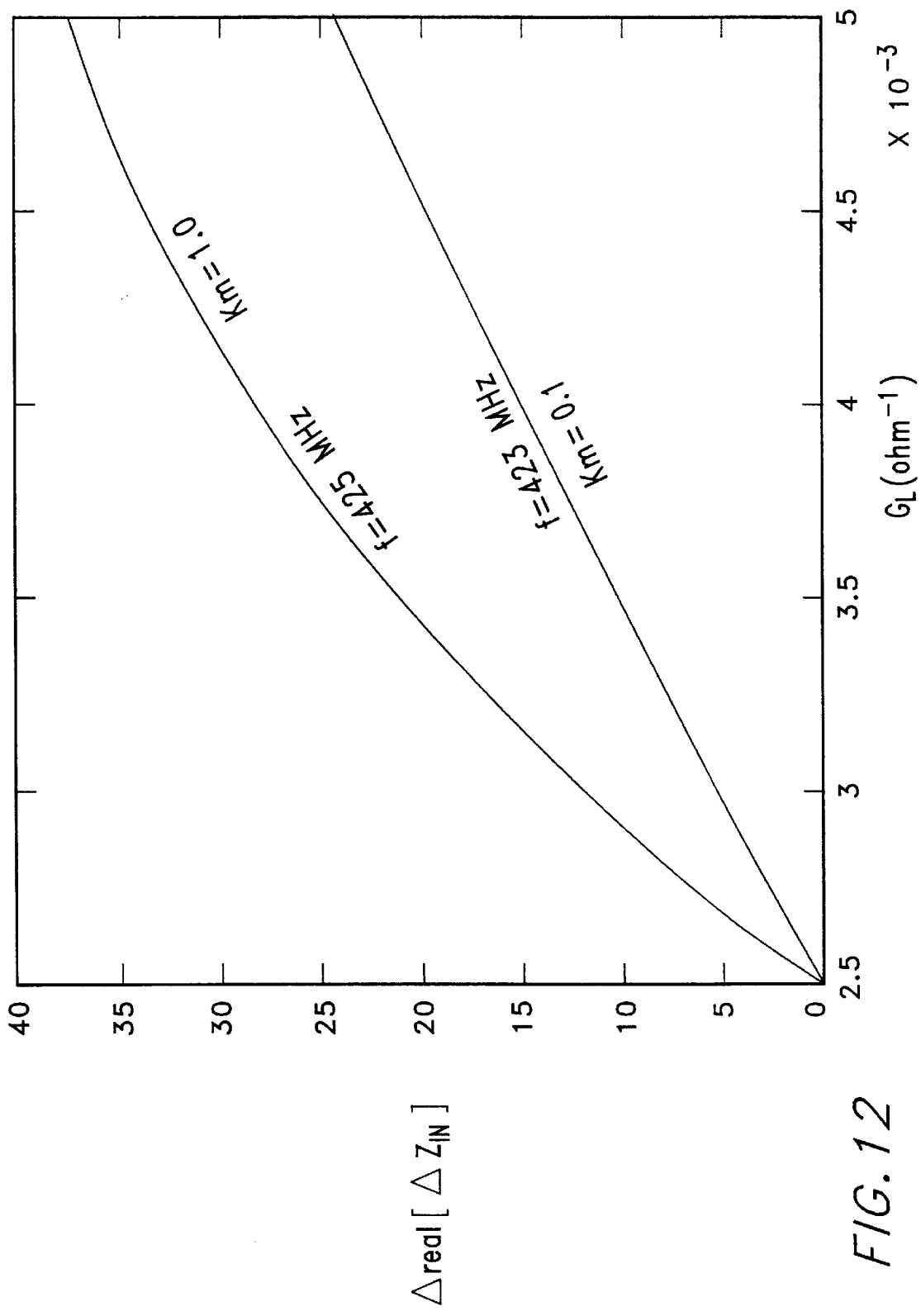
FIG. 12 is a graph of the real portion of the input impedance of the apparatus of FIG. 1 versus sample photoconductance for different values of oscillator frequency $f_o$ and a mutual inductance coupling coefficient $K_m$ equal to one.
Figure 13:
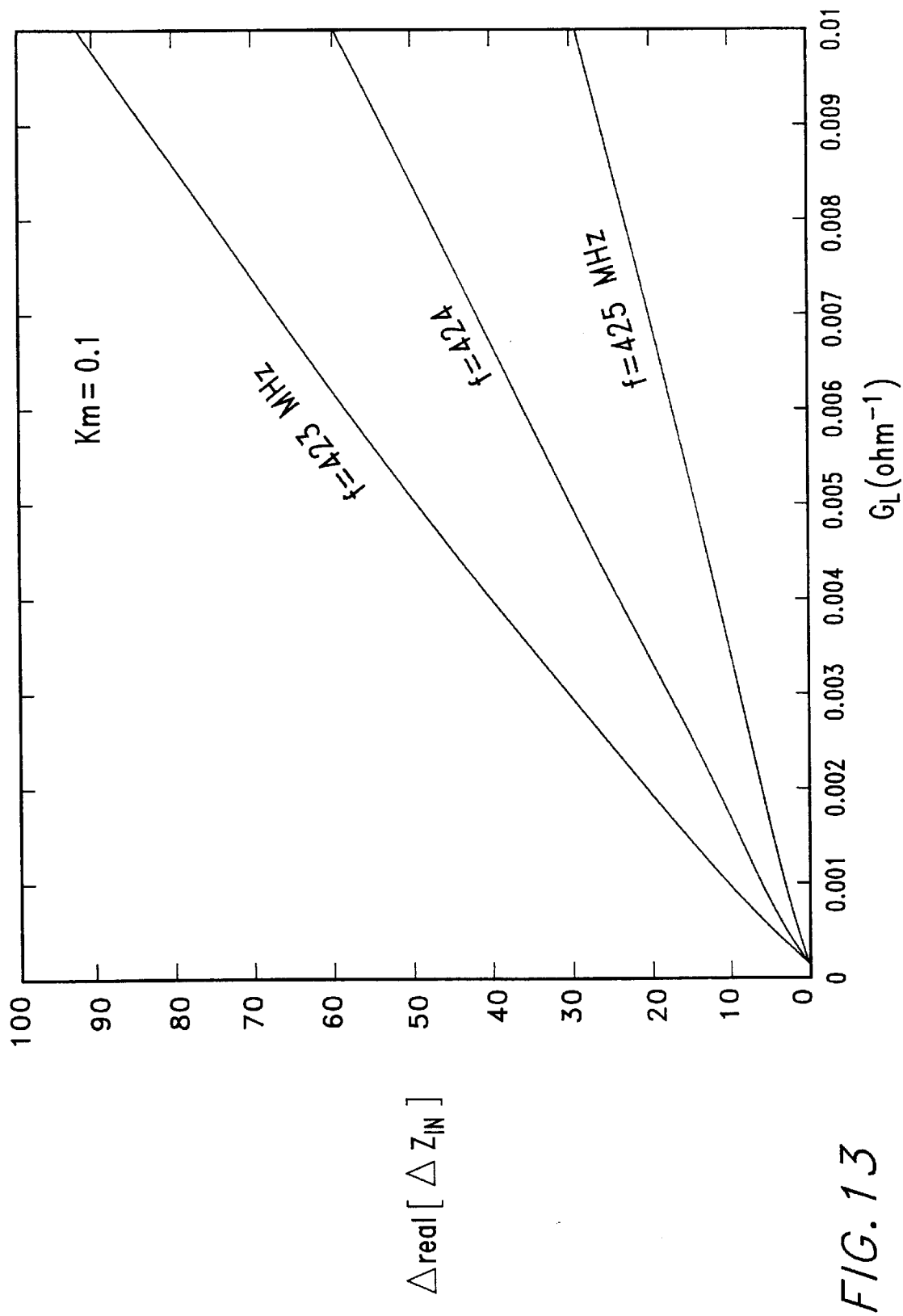
FIG. 13 is a graph of the real portion of the input impedance of the apparatus of FIG. 1 versus sample photoconductance for three different values of oscillator frequency $f_o$ and a mutual inductance coupling coefficient $K_m$ equal to 0.1.

As illustrated by the previous examples, the oscillator frequency $f_o$ is crucial to determining the maximum sensitivity of apparatus 30 while the mutual inductance coupling coefficient $K_m$ is important for determining both the linearity and sensitivity for the apparatus 30. Now referring to FIG. 12, when the apparatus 30 is configured to use an oscillator frequency $f_o$ of 435 MHz and a mutual inductance coupling coefficient $K_m$ of 1.0, the change in the real portion of the input impedance $Z_{IN}$ is non-linear with respect to the change in photoconductance $G_L$ of a sample 32. In contrast, when the apparatus 30 is configured to use an oscillator frequency $f_o$ of 423 MHz and a mutual inductance coupling coefficient $K_m$ of 0.1, the real portion of the input impedance $Z_{IN}$ is linear with respect to the photoconductance $G_L$ of a sample 32. Choosing an appropriate oscillator frequency $f_o$ is important, as illustrated in FIG. 13, to obtain the maximum value of the sensitivity and, as a result, the maximum value for the output voltage signal $V_{OUT}$. For the example configuration of the apparatus 30 illustrated in FIG. 13, the apparatus 30 exhibits its highest sensitivity, (i.e., its highest measurable output voltage signal $V_{OUT}$) when the oscillator frequency $f_o$ is 423 MHz.

Figure 14:
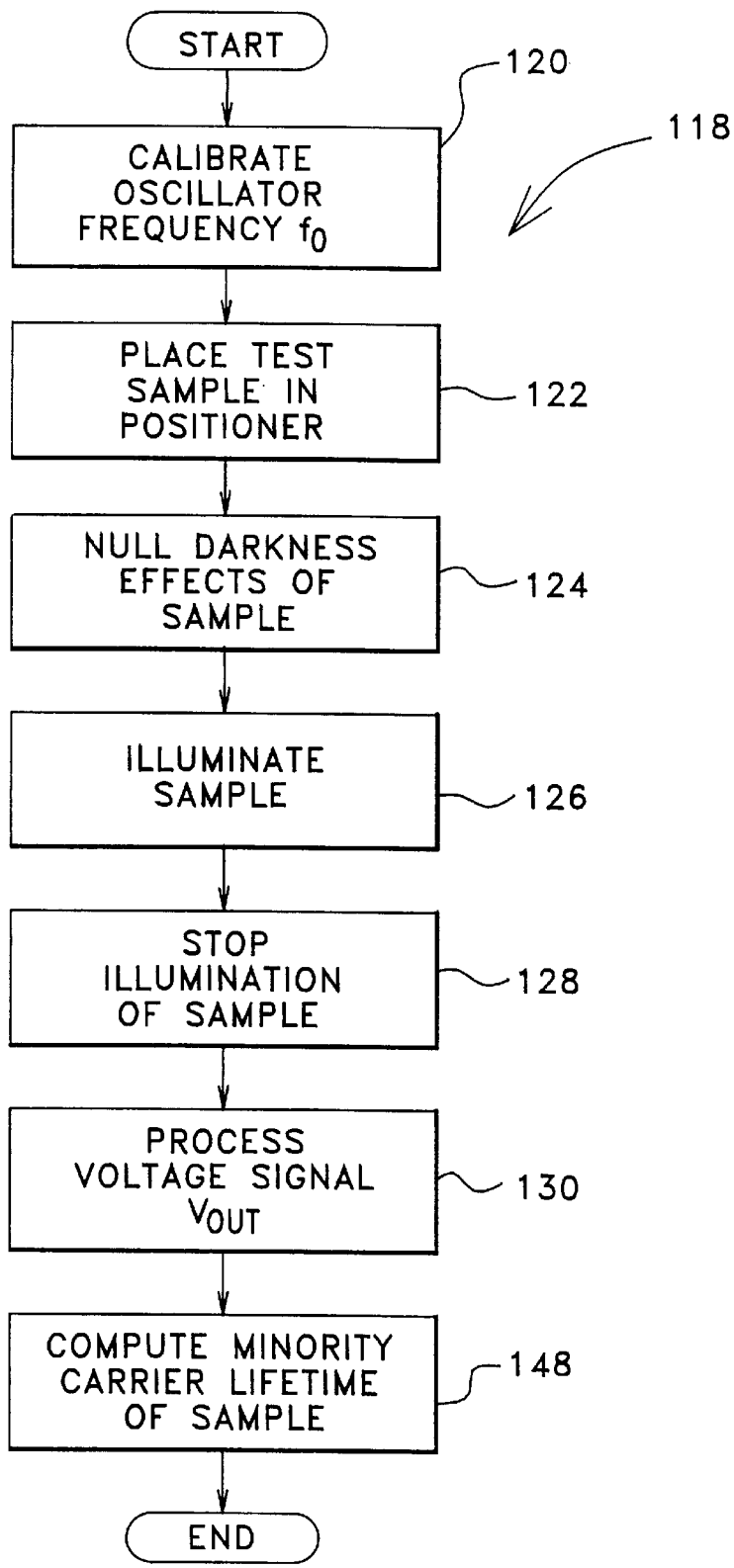
FIG. 14 is flow chart of the method of the present invention that can be used with the measuring apparatus of FIG. 1.
Figure 15:
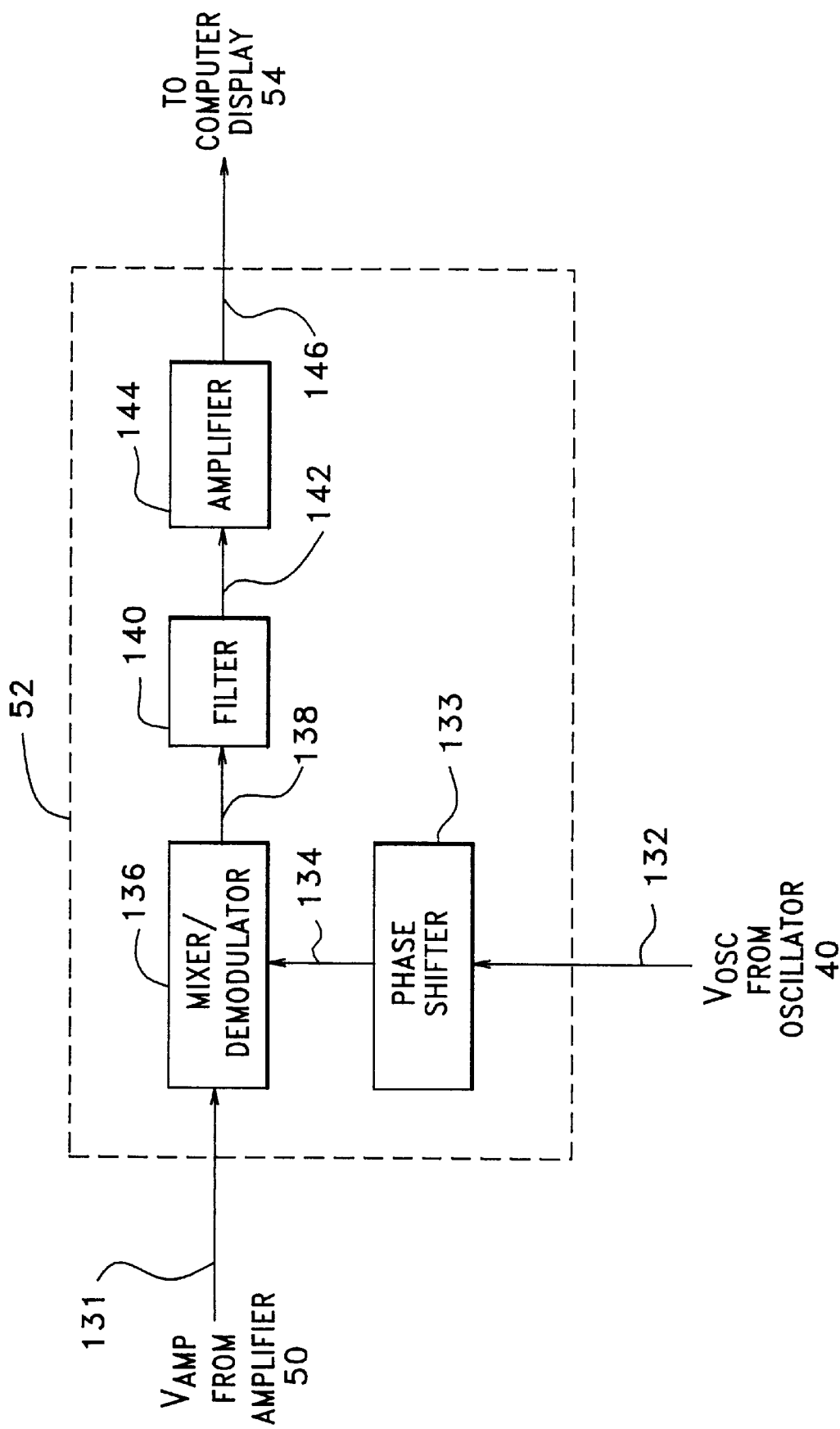
FIG. 15 is a more detailed functional block diagram of the signal processor of the apparatus of FIG. 1.

The operation of the measuring apparatus 30 will now be discussed in more detail, with reference to the circuit model shown in FIG. 6 previously discussed above. For purposes of illustration, but not limitation, the operation of the apparatus 30 will also be discussed in conjunction with the operational flow chart 118 provided in FIG. 14.

Prior to testing the first sample 32 with any particular configuration of the apparatus 30, the optimum oscillator frequency $f_o$ for the apparatus must be chosen in step 120. Since the resistors, capacitors, and inductors in the equivalent circuit provided in FIG. 6 may have variable values for different configurations of the apparatus 30, an optimum oscillator frequency $f_o$ must be determined empirically for each apparatus. As previously discussed above, to optimize the sensitivity of an apparatus 30, the oscillator frequency $f_o$ should be chosen such that a maximum voltage signal $V_{OUT}$ is obtained after illumination of the sample 32, which occurs when the real portion of the input impedance $Z_{IN}$ is at a maximum. Therefore, for a given configuration for the apparatus 30 (i.e., for a given equivalent circuit of the apparatus 30), the preferred oscillator frequency $f_o$ can be determined by varying the mutual inductance between a sample 32 and the coil 44 and the oscillator frequency $f_o$ until the oscillator frequency $f_o$ producing the highest output signal $V_{OUT}$ is obtained.

During the calibration step 120, it is preferred that the mutual inductance between the sample 32 and the coil 44 be adjusted for maximum signal response. An example result of the set oscillator frequency step 120 is illustrated in FIG. 13, wherein graphs of the real portion of the simulated input impedance $Z_{IN}$ versus sample photoconductance $G_L$ are provided for three different oscillator frequencies. The mutual inductance coupling coefficient $K_m$ is equal to 0.1 for this example. After the oscillator frequency $f_o$ is determined for a particular apparatus 30, the oscillator frequency $f_o$ is preferably not changed during the testing of samples unless the electrical configuration of the apparatus 30 is changed. By maintaining a constant oscillator frequency $f_o$, the apparatus will display a maximum sensitivity, even for semiconductor samples of very different sizes, shapes, and material properties. While it is preferable during step 120 that only the oscillator frequency $f_o$ be adjusted, the value for the capacitor 66 ($C_F$) can also be adjusted during step 120 in conjunction with the adjustment of the oscillator frequency $f_o$ to provide the apparatus 30 with a high sensitivity. In a similar fashion to the oscillator frequency $f_o$, however, once step 120 is completed for an apparatus 30, the value for the capacitor 66 ($C_F$) should not be changed or adjusted during the use of the apparatus 30 to test samples so that the apparatus 30 maintains its high sensitivity unless changing the value of the capacitor 66 is necessary to balance the bridge circuit 42 during the balancing step 124.

After the oscillator frequency $f_o$ for the apparatus 30 is determined during the calibration step 120, the apparatus 30 can be used to measured the minority carrier lifetimes of semiconductor samples. For a particular test, a sample 32 is preferably placed in the positioner 96 during step 122 such that the sample 32 is generally centered over the coil 44. After positioning of the sample 32 during step 122, the null darkness or dark conductivity effects of the sample 32 are removed during step 124 by moving the position of the sample 32 relative to the coil 44 with the positioner 96 or other suitable device until the voltage signal $V_{OUT}$ between the nodes 46, 47 equals approximately zero volts. Dark conductivity refers to the chemical conductivity of a semiconductor material exhibited by the semiconductor material in darkness or when the semiconductor material is not being illuminated. By balancing the bridge circuit 42 prior to illumination of the sample 32 during illumination step 126, the voltage signal $V_{OUT}$ signal detected between the nodes 46, 47 during and after the illumination step will be representative of only the electrical photoconductivity of sample 32 created by the illumination of the sample 32 by the laser or other light source 34. In order to balance the bridge circuit 42, the sample 32 is moved by the positioner 96 relative to the coil 44 until the voltage signal $V_{OUT}$ between the nodes 46, 47 is approximately zero volts, which is obtained when:

$$Z_{46,68}Z_{47,70} = Z_{47,68}Z_{46,70} \quad (9)$$

where $Z_{46,68}$ is the impedance between the nodes 46 and 68, $Z_{47,70}$ is the impedance between the nodes 47 and 70, $Z_{46,70}$ is the impedance between the nodes 46 and 70, and $Z_{47,68}$ is the impedance between the nodes 47 and 68. As illustrated in FIG. 1, the value for $Z_{46,70}$ is the fixed value for the resistor 64, the value for $Z_{47,70}$ is the fixed value for the resistor 62, and the value for $Z_{47,68}$ is the fixed value for the resistor 60. Therefore, the only variable in equation (9) is the value for $Z_{46,68}$ which is related to the value of $Z_{IN}$. Thus, balancing the bridge circuit 42 during step 124 requires that the impedance $Z_{46,68}$ be tuned to a constant value, despite the size, shape, and other properties of the sample 32, since the other values in equation (9) will always remain constant.

Since the oscillator frequency $f_o$ and the value for the capacitor 66 ($C_F$) preferably remain constant during balancing step 124, in order to obtain the proper impedance $Z_{46,68}$ to balance the bridge circuit 42 during step 124, the sample 32 is moved relative to the coil 44 until the correct impedance $Z_{46,68}$ is obtained. That is, the mutual inductance between the sample 32 and the coil 44 is adjusted until the desired impedance $Z_{46,68}$ is obtained. Maintaining a constant impedance $Z_{46,68}$ for various samples by only adjusting the distance between the sample 32 being tested and the coil 44 insures that the apparatus 30 remains linear and displays consistently high sensitivity, regardless of the sample being tested. That is, the input impedance $Z_{IN}$ remains linearly related to the photoconductance $G_L$ of the samples being tested, and the apparatus produces consistently measurable and accurate voltage signal $V_{OUT}$, as previously discussed above. A consistently linearly and highly sensitive apparatus 30 cannot generally be maintained for a wide range of sample sizes and conductivities with the mutual inductance fixed. The bridge circuit 42 can generally be balanced in this case by adjusting the oscillator frequency $f_o$ and the value for the capacitor 66 ($C_F$) after the apparatus is configured during step 120.

The balancing of the bridge circuit 42 during step 124 is preferably accomplished by adjusting only the distance between the sample 32 and the coil 44, which varies the mutual inductance between the sample 32 and the coil 44. The oscillator frequency $f_o$ is preferably not adjusted during the step 124, since frequency adjustment during step 124 will disturb the sensitivity of the apparatus 30, as previously discussed above in relation to step 120. Also, during the step 124, the sample 32 is preferably coupled with the coil 44 such that the mutual inductance between the sample 32 and the coil 44 produces the same impedance $Z_1$ regardless of the sample's parameters, such as size and photoconductivity, for large samples. As previously discussed above, if the mutual inductance coupling coefficient $K_m$ is too high (i.e., the sample 32 is too close to the coil 44), the apparatus 30 will not be linear. By adjusting the apparatus 30 during step 120 such that the apparatus 30 maintains a high sensitivity and balancing the bridge circuit 42 during step 124 by only moving or changing the position of the sample 32 relative to the coil 44, which changes the mutual inductance between the sample 32 and the coil 44, and not by adjusting the oscillator frequency $f_o$ during the step 124, it is believed that a suitable value for the mutual inductance coupling coefficient $K_m$ will be maintained for each sample tested.

After the null darkness or dark conductivity effects of the sample 32 are removed during step 124 by balancing the bridge circuit 42, a light source 34 illuminates the sample 32. The pulsed light source 34 can comprise any of a variety of light sources. A laser, such as, for example, a YAG laser generating a 1.064 micrometer wavelength pulse for three nanoseconds has been used in this invention. A mode locked, cavity dumped, dye laser, a flashlamp, or a noncoherent light source are other examples of suitable light sources. As previously discussed above, the sample 32 is preferably enclosed in a chamber or room such that the sample 32 is not illuminated by sources other than the light source 34.

Illumination of the sample 32 continues until step 126 when illumination of the sample 32 is discontinued. During the step 126 when the sample 32 being illuminated, a pulse of excess electrons and holes will be created within the semiconductor sample 32, which alters the electrical characteristics of the semiconductor sample 32, including the photoconductance $G_L$ of the sample 32 as well as the impedances $Z_1$ and $Z_{IN}$ to create a detectable and measurable voltage signal $V_{OUT}$ between the nodes 46, 47 in the bridge circuit 42. In other words, the illumination of the sample 32 during step 126 creates an unbalanced bridge circuit 42 due to the photoconductivity of the sample 32 created by the generation of excess electrons and holes in the sample 32, which changes the value for the impedance $Z_{46,68}$ in equation (9) and the impedance $Z_{IN}$, thereby creating a measurable voltage signal $V_{OUT}$ between the nodes 46, 47.

After pulsed illumination of the sample 32 during step 126, the excess electrons and holes created in the sample 32 by the illumination of the sample 32 will begin to recombine, thereby reducing the photoconductivity of the sample 32 and altering the voltage signal $V_{OUT}$ detected between the nodes 46, 47 in the bridge circuit 42. The rate of change in the voltage signal $V_{OUT}$ after the step 128 is indicative of the minority carrier lifetimes or carrier recombination rates of the sample 32, as will be discussed in more detail below.

After the pulsed illumination of the sample 32 during step 126, the voltage signal $V_{OUT}$ is processed during step 130 to obtain the portion of the voltage signal $V_{OUT}$ that is most indicative of, and useful in, the calculation of the minority carrier lifetime or excess carrier recombination rate of the sample 32 being tested. During the processing step 130, the voltage signal $V_{OUT}$ on the leads 48, 49 is first amplified by the amplifier 50. The amplifier 50 amplifies the voltage signal $V_{OUT}$ by a factor of approximately ten and provides the amplified voltage signal $V_{AMP}$ on the lead 131 connecting the amplifier 50 to the signal processor 52. The oscillator 40 also provides an input voltage signal $V_{OSC}$ to the signal processor 52 on the lead 132 which is equivalent to the signal provided on the leads 56, 58 to the bridge circuit 42. Therefore, both of the voltage signals $V_{AMP}$ and $V_{OSC}$ will have frequencies equal to the oscillator frequency $f_o$.

The signal processor 52 contains a phase shifter 133, which creates a shifted voltage signal $V_{SHIFT}$ on the lead 134 that is a phase shifted version of the voltage signal $V_{OSC}$ on the lead 132. The phase shifter 133 shifts the phase of the voltage signal $V_{OSC}$ on the lead 132 such that the voltage signals $V_{AMP}$ and $V_{SHIFT}$ are in phase. The voltage signal $V_{AMP}$ on the lead 131 and the voltage signal $V_{SHIFT}$ on the lead 134 are the input signals to the mixer/demodulator 136.

The mixer/demodulator 136 is a conventional and well known device that creates output signals representing the sum and difference of the two input voltage signals, $V_{AMP}$ and $V_{SHIFT}$, to the mixer/demodulator 136. Therefore, the mixer/demodulator 136 creates two voltage signals on the lead 138, a high frequency voltage signal having a frequency equal to approximately twice the oscillator frequency $f_o$ and a low frequency voltage signal $V_{FIN}$. Both voltage signals are proportional to the excess carrier density generated by the light pulse during the step 126. The high frequency voltage signal and the low frequency voltage signal $V_{FIN}$ on the lead 138 pass through the filter 140 which removes the high frequency voltage signal and passes through the low frequency voltage signal $V_{FIN}$ onto the lead 142. The low frequency voltage signal on the lead 142 can be optionally amplified by a factor of ten by an amplifier 144 and the amplified low frequency voltage signal $V_{AFIN}$ is an output voltage signal of the signal processor 52 on the lead 146 and an input signal to the computer/display or digital processing oscilloscope 54.

After the low frequency voltage signal $V_{AFIN}$ is processed by the signal processor or device 52, it is provided to the computer/display 54 on the lead 146 so that the minority carrier lifetime or recombination rate of the sample 32 can be computed and/or displayed or stored during step 148. It should be noted that there are many different mechanisms producing the minority carrier lifetime or excess carrier recombination lifetimes that can be determined from the voltage signal $V_{AFIN}$. There are even more different methods for determining the different mechanisms controlling minority carrier lifetime in materials. For example, different formulas are used to analyze the excess carrier recombination at the surface of the sample 32 than at the bulk or core of the sample 32. In addition, an instantaneous minority carrier lifetime measurement can be determined for a sample. However, instantaneous minority carrier lifetimes will vary over time for the same sample after pulsed illumination of the sample and the instantaneous minority carrier lifetime can be linear during some time intervals and non-linear during other time intervals. Persons of ordinary skill in the art are very familiar with how to determine a sample's minority carrier lifetimes or recombination lifetimes once the voltage signal $V_{AFIN}$ is obtained and, therefore, further discussions of how to compute the minority carrier lifetimes and recombination rates is not necessary for purposes of the present invention. For example, see Richard K. Ahrenkiel, Minority-Carrier Lifetime in III–V Semiconductors, in Semiconductors and Semimetals, Volume 39, Chapter 2, pp. 39–150 (1993), published by Academic Press, Inc., which is hereby incorporated by reference, for a discussion of methods for computing a semiconductor sample's minority carrier lifetime.

Figure 16:
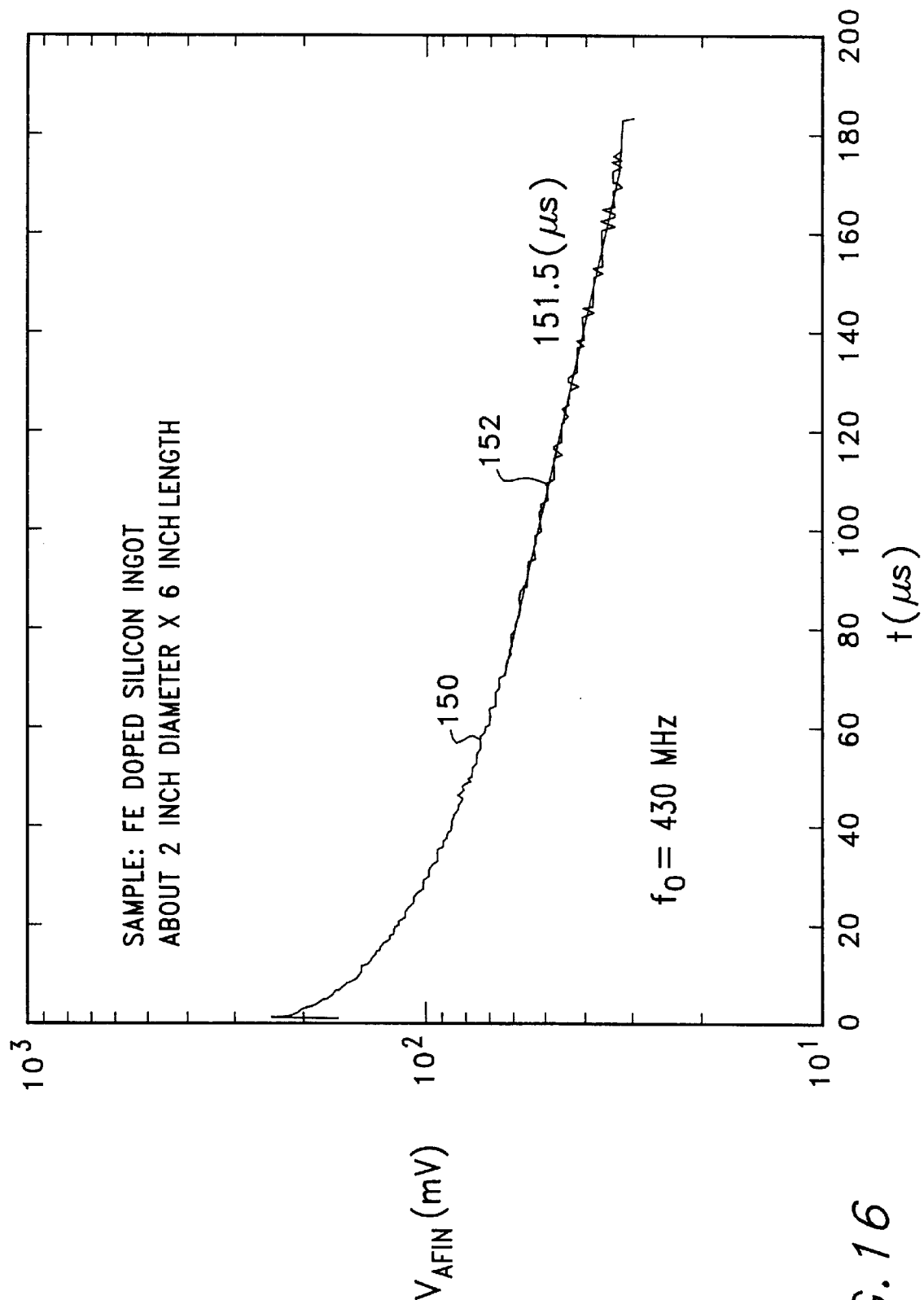
FIG. 16 is an example graph of a voltage signal $V_{FIN}$ created by the measuring apparatus of FIG. 1 and from which the minority carrier lifetime of the example sample being tested by the measuring apparatus can be determined.

An illustrative graph of a first example of the voltage signal $V_{AFIN}$ is provided in FIG. 16. The test sample comprised an iron doped silicon ingot having approximately a two inch diameter and approximately a six inch length and the oscillator frequency $f_o$ is 430 MHz. The instantaneous minority carrier lifetime of the sample is determined from the measurement the slope of the curve 150, as indicated by the line 152 that approximates the curve 150. The instantaneous minority carrier lifetime measurement can be determined from any part of the curve 150. For the example illustrated in FIG. 16, the instantaneous minority carrier lifetime of the sample under test is approximately 151.5 microseconds at the portions of the curve 150 approximated by the line 152.

Figure 17:
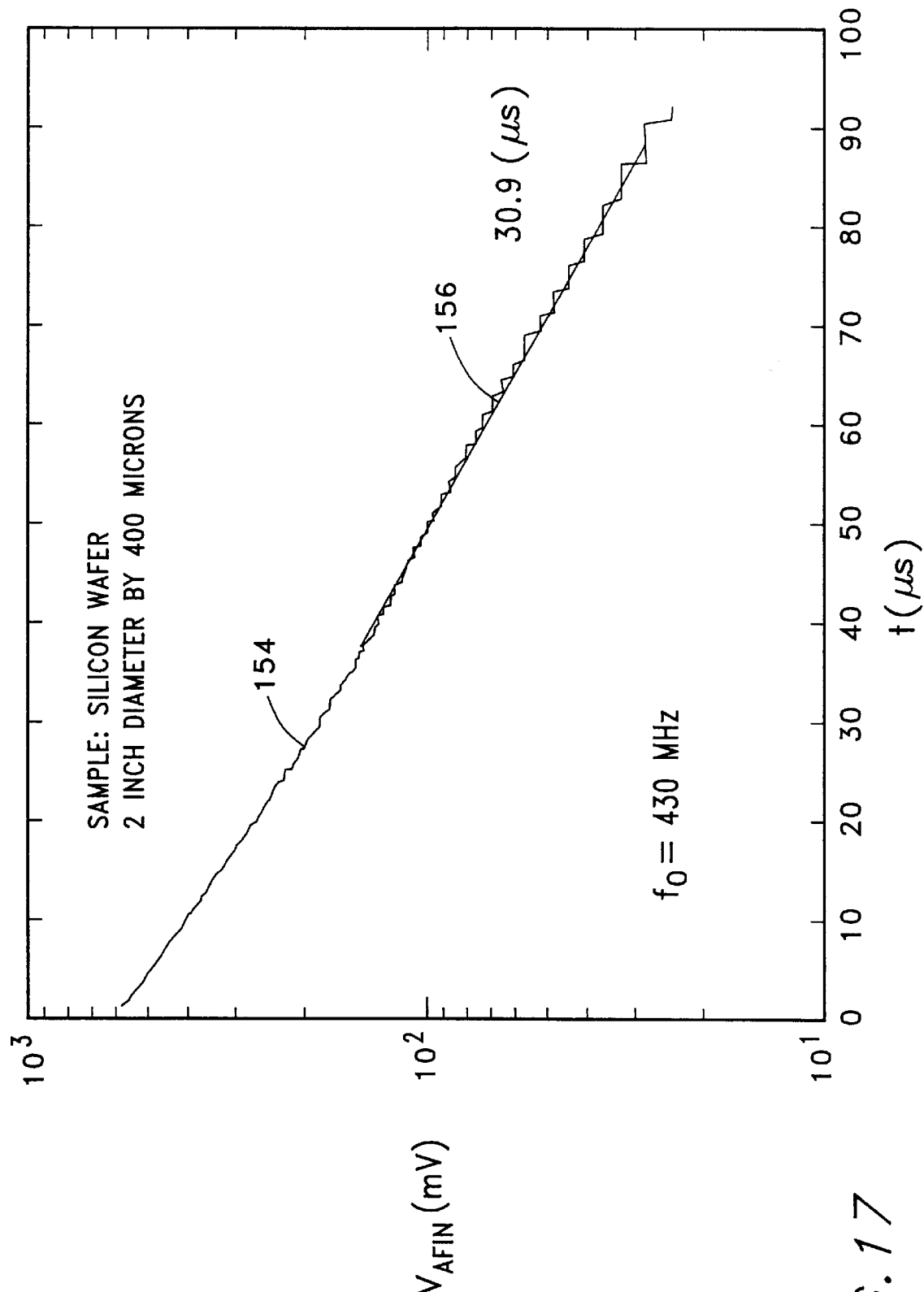
FIG. 17 is another example graph of a voltage signal $V_{FIN}$ created by the measuring apparatus of FIG. 1 and from which the minority carrier lifetime of the second example sample being tested by the measuring apparatus can be determined.

Another illustrative example of a voltage signal $V_{AFIN}$ generated by the apparatus 30 for a different test sample is provided in FIG. 17. The second test sample comprised a silicon wafer having approximately a two inch diameter and a thickness of 400 microns. Like the previous example, the oscillator frequency $f_o$ is 430 MHz. The instantaneous minority carrier lifetime of the sample is determined from the measurement the slope of the curve 154, as indicated by the line 156 that approximates the curve 154. Similar to the first example, the instantaneous minority carrier lifetime measurement can be taken at any portion of the curve 154. For the example illustrated in FIG. 17, the instantaneous minority carrier lifetime of the sample under test is approximately 30.9 microseconds at the portions of the curve 154 approximated by the line 156.

The foregoing description is considered as illustrative only of the principles of the invention. Furthermore, since numerous modifications and changes will readily occur to those skilled in the art, it is not desired to limit the invention to the exact construction and process shown and described above. Accordingly, all suitable modifications and equivalents may be resorted to falling within the scope of the invention as defined by the claims which follow.

For example, while the apparatus 30 uses a bridge circuit, other electrical configurations or circuits could also be used to negate or tune out the dark conductivity of a sample being tested or to otherwise negate or remove the effects of conduction within the sample prior to illumination of the sample with a laser beam or other light sources. As another example, while in the discussion above, mutual inductance between a sample and the coil is primarily adjusted by changing the distance or spatial relationship between the sample and the coil, instead of varying the spacing between the sample and coil, the mutual inductance could be varied by inserting a spacer, slide, or other material or object between the sample and the coil to affect or adjust the magnetic coupling between the sample and the coil.

The embodiments of the invention in which an exclusive property or privilege is claimed are defined as follows:

1. Apparatus for measuring carrier lifetime in a semiconductor material sample, comprising:
   a coil;
   a positioner capable of positioning the sample in proximity to said coil;
   a light source;
   a bridge circuit having four nodes connected by four branches, three of said four branches including resistive elements and the remaining branch including a capacitive element in electrical parallel with a connection to said coil; and
   an oscillator connected to two of said nodes of said bridge circuit such that said oscillator can apply a voltage signal to said two of said four nodes of said bridge circuit.

2. The apparatus of claim 1, wherein said oscillator produces a voltage signal having a frequency between 400 MHz and 460 MHz.

3. The apparatus of claim 1, including an amplifier connected to two of said nodes of said bridge circuit, both of the two nodes to which said amplifier is connected being different from the two nodes to which said oscillator is connected.

4. The apparatus of claim 1, wherein said light source is capable of generated pulses of light.

5. The apparatus of claim 1, wherein said light source is a laser.

6. The apparatus of claim 1, wherein said connection between said fourth branch of said bridge circuit and said coil comprises a coaxial cable.

7. The apparatus of claim 1, including a capacitive element in series with said coil in said fourth branch of said bridge circuit.

8. A method for determining carrier lifetime or recombination rate of semiconductor method sample, comprising the steps of:
applying an input voltage signal having a frequency to two nodes of a bridge circuit having four branches, wherein three branches of said bridge circuit include resistive elements and a fourth branch of said bridge circuit includes a primary capacitive element in parallel with a connection to a coil;
positioning the sample in proximity to said coil;
balancing said bridge circuit by adjusting mutual inductance between the sample and said coil;
illuminating the sample for a finite period of time; and
measuring an output voltage signal at two nodes of said bridge circuit which are different from the two nodes of said bridge circuit to which said input voltage signal is applied.

9. The method of claim 8, including the step of calibrating said frequency of said input voltage signal prior to the said step of applying said input voltage signal to said bridge circuit.

10. The method of claim 9, wherein said step of calibrating said frequency of said input voltage signal includes varying mutual inductance between the sample and said coil and varying said frequency until said output voltage signal's amplitude is maximized.

11. The method of claim 9, wherein said step of calibrating said frequency of said input voltage signal includes varying mutual inductance between the sample and said coil and varying said frequency until a real portion of an impedance of said fourth branch is maximized.

12. The method of claim 8, wherein said fourth branch of said bridge circuit includes a secondary capacitive element in series with said coil.

13. The method of claim 8, wherein said step of balancing said bridge circuit includes maintaining said frequency of said input voltage signal constant when said mutual inductance between the sample and said coil is adjusted.

14. The method of claim 8, wherein said step of balancing said bridge circuit includes maintaining said primary capacitive element at a constant value when said mutual inductance between the sample and said coil is adjusted.

15. The method of claim 8, wherein said frequency of said input voltage signal is preferably in a range between 400 MHz and 460 MHz.

16. The method of claim 15, wherein said frequency of said input voltage signal is optimally in a range between 420 MHz and 430 MHz.

17. The method of claim 8, wherein said step of balancing said bridge circuit occurs when the sample is shielded from illumination.

18. The method of claim 8, wherein said step of illuminating the sample includes illuminating the sample with pulsed light.

19. The method of claim 8, wherein said step of balancing said bridge circuit by adjusting the mutual inductance between the sample and said coil includes adjusting the distance between the sample and said coil.

20. The method of claim 19, wherein said step of balancing said bridge circuit by adjusting the mutual inductance between the sample and said coil includes adjusting the distance between the sample and said coil such that a real portion of an input impedance of said fourth branch of said bridge circuit remains generally constant during use of the apparatus.

21. The method of claim 8, wherein said step of balancing said bridge circuit by adjusting the mutual inductance between the sample and said coil includes maintaining a real portion of an input impedance of said fourth branch of said bridge circuit in generally linear relationship to the sample's photoconductance.

22. The method of claim 8, wherein mutual inductance between said coil and the sample is preferably less than 0.1.

23. A method of measuring carrier lifetime or recombination rate of a semiconductor material sample, comprising the steps of:
applying an input voltage signal having a frequency to two nodes of a bridge circuit having four branches, wherein three branches of said bridge circuit include resistive elements and a fourth branch of said bridge circuit includes a capacitive element in parallel with a connection to a coil;
positioning the semiconductor material in proximity to said coil;
calibrating said frequency of said input voltage signal;
balancing said bridge circuit by adjusting mutual inductance between sample semiconductor material and said coil;
illuminating said semiconductor material for a finite period of time; and
measuring an output voltage signal at two nodes of said bridge circuit which are different from the two nodes of said bridge circuit to which said input voltage signal is applied.

24. The method of claim 23, wherein said step of balancing said bridge circuit includes maintaining said frequency of said voltage signal constant when said mutual inductance between said sample of semiconductor material and said coil is adjusted.

25. The method of claim 23, wherein said step of balancing said bridge circuit includes maintaining said capacitive element at a constant value when said mutual inductance between said sample of semiconductor material and said coil is adjusted.

26. The method of claim 23, including the step of adjusting said mutual inductance by moving the semiconductor material in relation to the coil.

27. The method of claim 23, including the step of adjusting said mutual inductance by varying spatial relationship between said semiconductor material and said coil.

28. Apparatus for measuring carrier lifetime or recombination rate in a semiconductor material, comprising
a bridge circuit having four nodes connected by four branches, three of which branches have resistive components and a fourth of which branches has a capacitive component;
a coil positioned at a distance spaced apart from said semiconductor material in an adjustable manner such that said distance is variable, said coil being connected electrically to said fourth branch of said bridge circuit in parallel with said capacitance element;

an oscillator connected to two of said nodes of said bridge circuit in such a manner that said oscillator imparts a voltage signal across said two of said nodes;

a light source positioned to illuminate the semiconductor material with a pulse of light; and a voltage detector connected electrically across two of the nodes of said bridge circuit that are not the same nodes to which the oscillator is connected.

29. A method for determining carrier lifetime of a sample of semiconductor material, comprising the steps of:

providing a circuit capable of creating an output circuit indicative of the sample's conductivity when the sample is illuminated and of eliminating any portion of said output signal that is indicative of the sample's dark conductivity;

magnetically coupling said circuit and the sample;

adjusting mutual inductance between the sample and said circuit such that said output signal is eliminated;

illuminating the sample for a finite period of time; and measuring said output signal.

30. The method of claim 29, wherein said step of adjusting mutual inductance between said coil and the sample includes adjusting distance between said coil and the sample.

* * * * *